(12) United States Patent
Ammo

(10) Patent No.: US 9,363,451 B2
(45) Date of Patent: Jun. 7, 2016

(54) SOLID-STATE IMAGING DEVICE, METHOD OF MANUFACTURING SOLID-STATE IMAGING DEVICE, AND ELECTRONIC APPARATUS

(71) Applicant: Sony Corporation, Tokyo (JP)

(72) Inventor: Hiroaki Ammo, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/363,971

(22) PCT Filed: Dec. 7, 2012

(86) PCT No.: PCT/JP2012/081755
§ 371 (c)(1),
(2) Date: Jun. 9, 2014

(87) PCT Pub. No.: WO2013/094430
PCT Pub. Date: Jun. 27, 2013

(65) Prior Publication Data
US 2014/0327059 A1  Nov. 6, 2014

(30) Foreign Application Priority Data
Dec. 19, 2011 (JP) ................................. 2011-277076

(51) Int. Cl.
*H04N 5/357* (2011.01)
*H04N 5/374* (2011.01)
(Continued)

(52) U.S. Cl.
CPC .......... *H04N 5/357* (2013.01); *H01L 27/14614* (2013.01); *H01L 27/14643* (2013.01); *H04N 5/374* (2013.01); *H04N 5/3745* (2013.01); *H01L 27/14689* (2013.01)

(58) Field of Classification Search
CPC ............ H01L 27/146–27/14893; H04N 5/357; H04N 5/374; H04N 5/3745
USPC ............... 250/208.1; 348/308, 300, 302, 241, 348/243; 257/291, 292, 365, 401
See application file for complete search history.

(56) References Cited

U.S. PATENT DOCUMENTS

| 2004/0036126 A1* | 2/2004 | Chau | ........................ B82Y 10/00 257/401 |
| 2006/0275990 A1* | 12/2006 | Itonaga | ............... H01L 29/6656 438/286 |

(Continued)

FOREIGN PATENT DOCUMENTS

| JP | 06-302817 | 10/1994 |
| JP | 2000-124437 | 4/2000 |

(Continued)

OTHER PUBLICATIONS

Leyris, C., et al., "Modeling of the Temporal Pixel to Pixel Noise of CMOS Image Sensors", International Image Sensor Workshop, 2007.

*Primary Examiner* — Tuan Ho
*Assistant Examiner* — Marly Camargo
(74) *Attorney, Agent, or Firm* — Chip Law Group; Pramod Chintalapoodi

(57) ABSTRACT

The present technique relates to a solid-state imaging device, a solid-state imaging device manufacturing method, and an electronic apparatus that are capable of providing a solid-state imaging device that can prevent generation of RTS noise due to miniaturization of amplifying transistors, and can achieve a smaller size and a higher degree of integration accordingly.
A solid-state imaging device (1-1) includes: a photodiode (PD) as a photoelectric conversion unit; a transfer gate (TG) that reads out charges from the photodiode (PD); a floating diffusion (FD) from which the charges of the photodiode (PD) are read by an operation of the transfer gate (TG); and an amplifying transistor (Tr3) connected to the floating diffusion (FD). More particularly, the amplifying transistor (Tr3) is of a fully-depleted type. Such an amplifying transistor includes an amplifier gate (AG) (gate electrode) extending in a direction perpendicular to convex strips (33) formed by processing a surface layer of a semiconductor layer (11), for example.

15 Claims, 13 Drawing Sheets

(51) Int. Cl.
*H04N 5/3745* (2011.01)
*H01L 27/146* (2006.01)

(56) References Cited

U.S. PATENT DOCUMENTS

2010/0025767 A1* 2/2010 Inaba ................ H01L 29/41791
257/365
2011/0134264 A1* 6/2011 Nishihara ......... H01L 27/14609
348/222.1
2013/0140442 A1* 6/2013 Yanagita ................. H01L 31/08
250/214 A

FOREIGN PATENT DOCUMENTS

| JP | 2005-528810 | | 9/2005 | |
| --- | --- | --- | --- | --- |
| JP | 2006-012924 | | 1/2006 | |
| JP | 2006-024787 | * | 1/2006 | ............ H01L 27/146 |
| JP | 2008-218445 | | 9/2008 | |
| JP | 2008-300835 | | 12/2008 | |
| JP | 2010-040630 | | 2/2010 | |

* cited by examiner

SOLID-STATE IMAGING DEVICE, METHOD OF MANUFACTURING SOLID-STATE IMAGING DEVICE, AND ELECTRONIC APPARATUS

TECHNICAL FIELD

The present technique relates to solid-state imaging devices, solid-state imaging device manufacturing methods, and electronic apparatuses, and more particularly, to a solid-state imaging device having amplifying transistors in pixel drive circuits, a method of manufacturing the solid-state imaging device, and an electronic apparatus using the solid-state imaging device.

BACKGROUND ART

Among solid-state imaging devices, there are CMOS sensors. In a CMOS sensor that has pixel drive circuits for respective pixels, charges converted by the photoelectric conversion units of the respective pixels are amplified by amplifying transistors (source followers) included in the pixel drive circuits, and the amplified charges are output to vertical signal lines by a switching operation (see Non-Patent Document 1 below).

CITATION LIST

Non-Patent Document

Non-Patent Document 1: International Image Sensor Workshop 2007 (June 7-10, Ogunquit, Me., USA), "Modeling of the Temporal Pixel to Pixel Noise of CMOS Image Sensors", pp. 219-222, [Search Date: Dec. 15, 2011], the Internet address (URL:http://www.imagesensors.org/Past%20Workshops/2007%20 Workshop/2007%20Papers/056%20Leyris%20et%20al.pdf)

SUMMARY OF THE INVENTION

Problems to be Solved by the Invention

In recent years, solid-state imaging devices have become smaller in size and higher in the degree of integration, and accordingly, miniaturization of the elements that constitute the pixel drive circuits has been progressing. In CMOS sensors, however, RTS (Random Telegraph Signal) noise is generated due to miniaturization of amplifying transistors (source followers) as described in Non-Patent Document 1, and the noise forms blinking points that degrade display characteristics.

In view of the above, the present technique aims to provide a solid-state imaging device that can prevent generation of RTS noise due to miniaturization of amplifying transistors, and can achieve a smaller size and a higher degree of integration accordingly. The present technique also aims to provide a method of manufacturing such a solid-state imaging device, and an electronic apparatus using such a solid-state imaging device.

Solutions to Problems

A solid-state imaging device according to the present technique for achieving the above objects includes: a photoelectric conversion unit; a transfer gate that reads out charges from the photoelectric conversion unit; a floating diffusion from which the charges of the photoelectric conversion unit are read by an operation of the transfer gate; and an amplifying transistor of a fully-depleted type that is connected to the floating diffusion. More particularly, the amplifying transistor is of a fully-depleted type. Such an amplifying transistor includes a gate electrode extending in a direction perpendicular to convex strips formed by processing a surface layer of a semiconductor layer, for example.

A solid-state imaging device manufacturing method according to the present technique includes: forming convex strips by processing a surface layer of a semiconductor layer; forming a photoelectric conversion unit in the semiconductor layer; and forming a floating diffusion that is located in the surface layer of the semiconductor layer and is in the vicinity of the photoelectric conversion unit. The manufacturing method also includes: forming a transfer gate on the surface of the semiconductor layer between the photoelectric conversion unit and the floating diffusion, and forming a gate interconnect that is connected to the floating diffusion and extends in a direction perpendicular to the convex strips.

The present technique also provides an electronic apparatus that includes the above described solid-state imaging device.

In the solid-state imaging device having the above described structure, the amplifying transistor connected to the floating diffusion has a fully-depleted structure that operates as a transistor without containing any impurity in the channel portion. Accordingly, generation of RTS (Random Telegraph Signal) noise due to fluctuations of the channel impurity in amplifying transistors is prevented, and the amplifying transistors are miniaturized.

Effects of the Invention

As described above, according to the present technique, amplifying transistors of a fully-depleted type that can prevent generation of RTS noise are used. Accordingly, further miniaturization of amplifying transistors is realized, and a reduction in size and an increase in the degree of integration can be achieved in a solid-state imaging device. Also, a reduction in size can be achieved in an electronic apparatus that uses such a solid-state imaging device.

MODES FOR CARRYING OUT THE INVENTION

Figure 1:
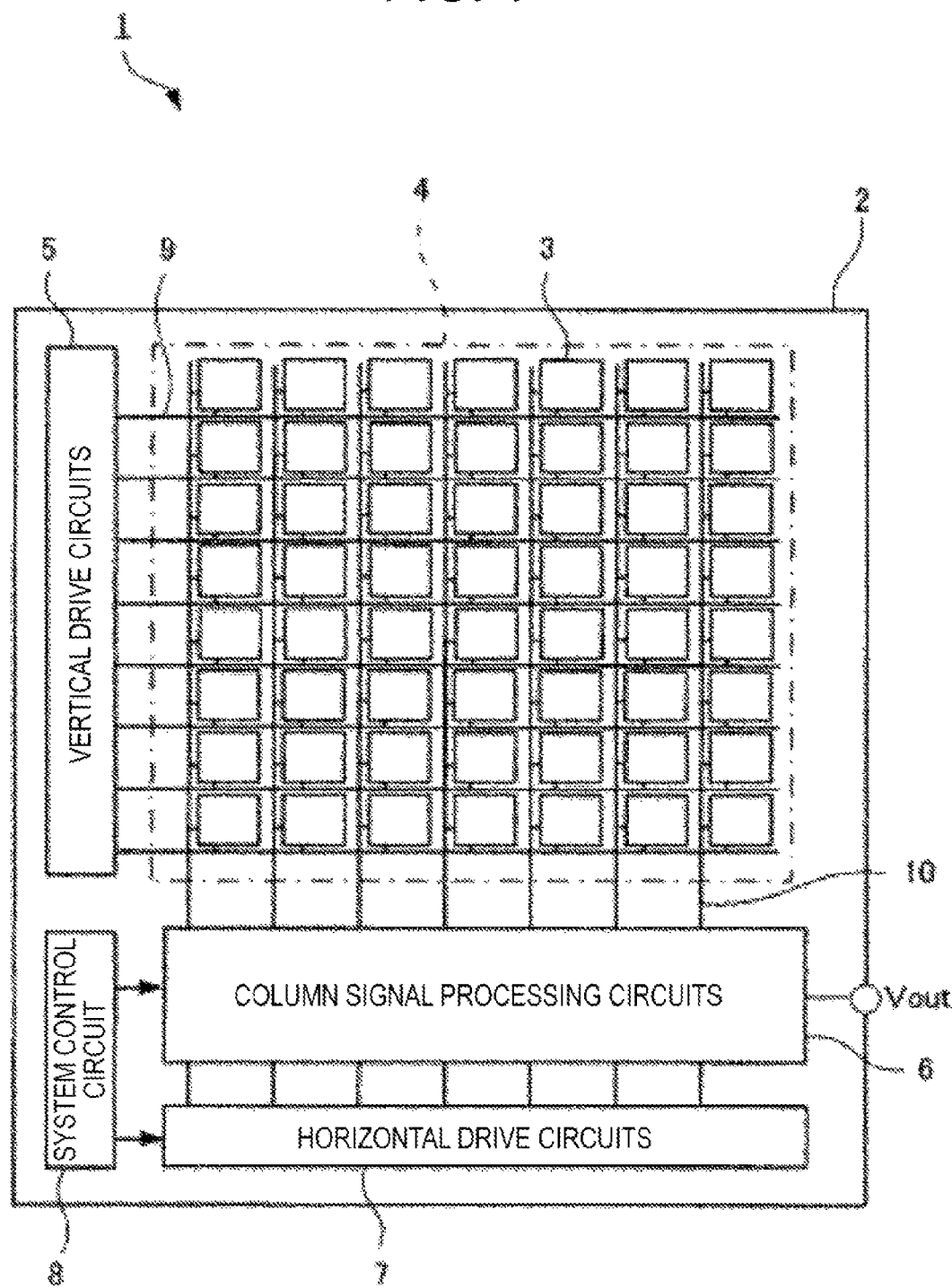
FIG. 1 is a schematic view of an example structure of a solid-state imaging device to which the present technique is applied.

Embodiments of the present technique are described in the following order, with reference to the accompanying drawings.
1. Outline of an example structure of a solid-state imaging device according to an embodiment
2. First embodiment (an example including a fully-depleted amplifying transistor and a sidewall transfer gate)
3. Second embodiment (an example including a fully-depleted amplifying transistor and a photoelectric conversion unit having a stack structure)
4. Third embodiment (an example of an electronic apparatus using a solid-state imaging device)

In the respective embodiments, like components are denoted by like reference numerals, and the same explanation will not be made more than once.

1. Outline of an Example Structure of a Solid-State Imaging Device According to an Embodiment FIG. 1 schematically shows the structure of a solid-state imaging device using a MOS solid-state imaging device as an example of a solid-state imaging device according to the present technique.

The solid-state imaging device 1 shown in this drawing has a pixel area 4 in which pixels 3 each including a photoelectric conversion unit are two-dimensionally arranged on a surface of a supporting substrate 2. Each of the pixels 3 arranged in the pixel area 4 has a pixel circuit that is formed with a photoelectric conversion unit, a floating diffusion, a read gate, and other transistors (so-called MOS transistors), as will be described below. In some cases, two or more pixels 3 share part of the pixel circuit.

In the regions surrounding the pixel area 4, peripheral circuits such as vertical drive circuits 5, column signal processing circuits 6, horizontal drive circuits 7, and a system control circuit 8 are provided.

The vertical drive circuits 5 are formed with shift registers, for example, select pixel drive lines 9, supply a pulse for driving the pixels 3 to the selected pixel drive lines 9, and drive the pixels 3 arranged in the pixel area 4 on a row-by-row basis. That is, the vertical drive circuits 5 selectively scan the respective pixels arranged in the pixel area 4 on a row-by-row basis sequentially in the vertical direction. The vertical drive circuits 5 then supply pixel signals based on signal charges generated in accordance with the amounts of light received by the respective pixels 3, to the column signal processing circuits 6 through vertical signal lines 10 that are arranged in a direction perpendicular to the pixel drive lines 9.

The column signal processing circuits 6 are provided for the respective columns of the pixels, for example, and perform, on a column-by-column basis, signal processing such as denoising on signals that are output from the pixels 3 of one row. Specifically, the column signal processing circuits 6 perform signal processing, such as correlated double sampling (CDS) for removing fixed pattern noise inherent to pixels, signal amplification, and analog-digital (AD) conversion.

The horizontal drive circuits 7 are formed with shift registers, for example, and sequentially output horizontal scan pulses, to sequentially select the respective column signal processing circuits 6, and cause the respective column signal processing circuits 6 to output pixel signals.

The system control circuit 8 receives an input clock and data indicating an operation mode, and outputs data such as internal information about the solid-state imaging device 1. Specifically, based on a vertical synchronization signal, a horizontal synchronization signal, and a master clock, the system control circuit 8 generates a clock signal and a control signal that set standards for operations of the vertical drive circuits 5, the column signal processing circuits 6, the horizontal drive circuits 7, and the like. Those signals are then input to the vertical drive circuits 5, the column signal processing circuits 6, the horizontal drive circuits 7, and the like.

The above described peripheral circuits 5 through 8 and the pixel circuits provided in the pixel area 4 constitute the drive circuits for driving the respective pixels. The peripheral circuits 5 through 8 may be located in such positions as to be stacked on the pixel area 4.

Figure 2:
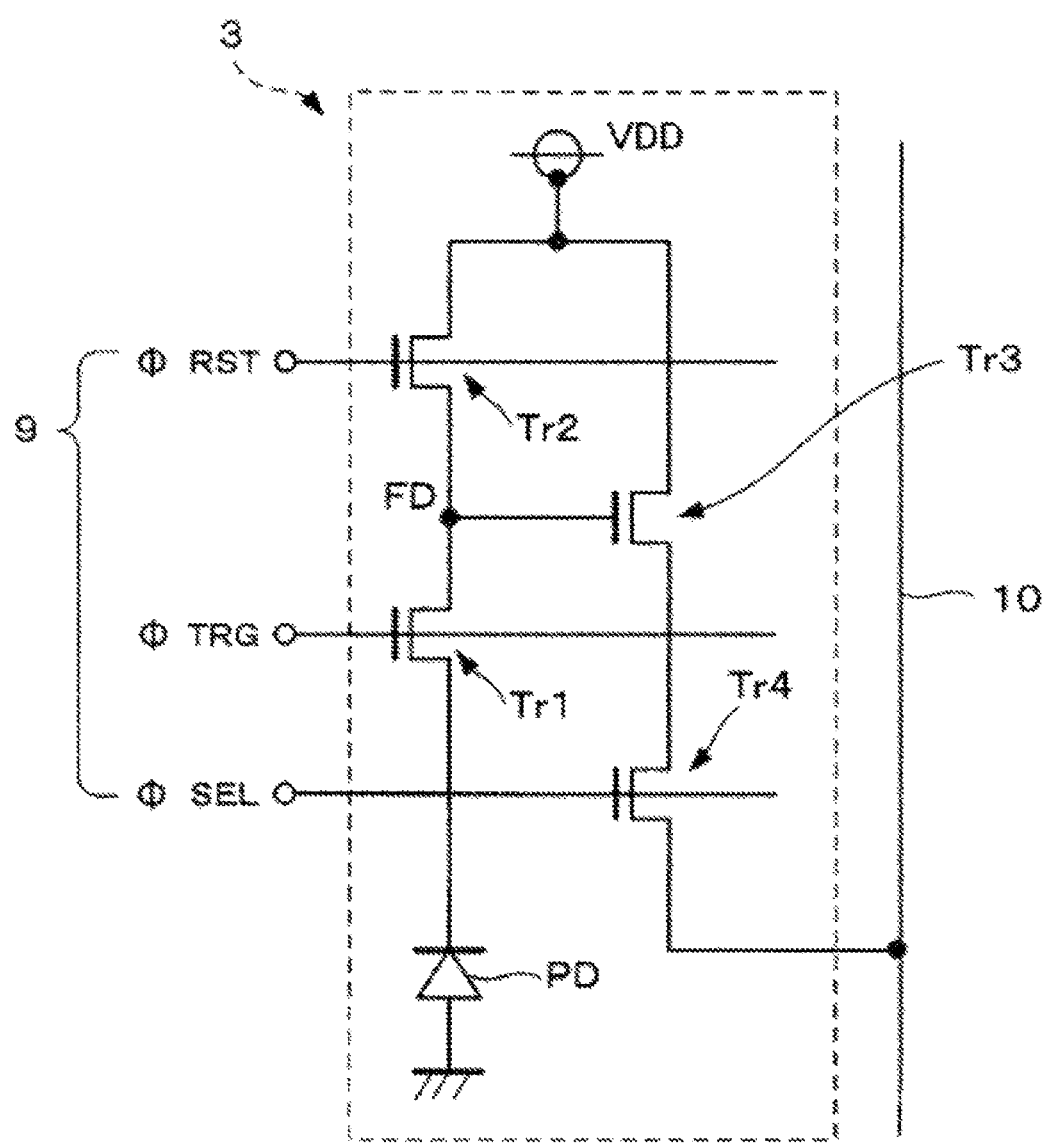
FIG. 2 is a schematic view of an example structure of a pixel drive circuit of a solid-state imaging device to which the present technique is applied.

FIG. 2 is an equivalent circuit diagram of the pixel circuit provided in each of the pixels 3. Each of the pixels 3 in this example includes a photodiode PD that forms a photoelectric conversion unit, and four pixel transistors. The four pixel transistors are formed with a transfer transistor Tr1, a reset transistor Tr2, an amplifying transistor Tr3, and a select transistor Tr4. Here, the transfer transistors Tr1 through Tr4 are n-channel MOS transistors, for example.

The photodiode PD is connected to the transfer transistor Tr1. The transfer transistor Tr1 is connected to the reset transistor Tr2 via a floating diffusion portion FD. Signal charges (electrons in this case) that are photoelectrically converted by the photodiode PD and are stored therein are transferred to the floating diffusion portion FD when a transfer pulse φTRG is applied to the gate (transfer gate) of the transfer transistor Tr1. The transfer pulse φTRG is supplied through one of the pixel drive lines 9.

The floating diffusion portion FD is connected to the gate of the amplifying transistor Tr3. The drain of the amplifying transistor Tr3 and the drain of the reset transistor Tr2 are connected to a power supply VDD. Here, the source of the reset transistor Tr2 (or the drain of the transfer transistor Tr1) serves as the floating diffusion portion FD. Before signal charges are transferred from the photodiode PD to the floating diffusion portion FD, a reset pulse pRST is applied to the reset gate, to reset the potential of the floating diffusion portion FD. The reset pulse pRST is supplied through one of the pixel drive lines 9.

The source of the amplifying transistor Tr3 is connected to the drain of the select transistor Tr4, and the source of the select transistor is connected to the vertical signal line 10. A select pulse pSEL is applied to the gate of the select transistor Tr4, so that the select transistor Tr4 is put into an ON state, and the pixel 3 is selected. The select pulse pSEL is supplied through one of the pixel drive lines 9. The amplifying transistor Tr3 outputs the potential of the floating diffusion portion FD reset by the reset transistor Tr2 as the reset level to the vertical signal line 10 via the select transistor Tr4. After signal charges are transferred by the transfer transistor Tr1, the amplifying transistor Tr3 outputs the potential of the floating diffusion portion FD as the signal level to the vertical signal line 10 via the select transistor Tr4. Alternatively, the select transistor Tr4 may be connected between the power supply VDD and the drain of the amplifying transistor Tr3. In that case, the source of the amplifying transistor Tr3 is connected to the vertical signal line 10.

2. First Embodiment

Structure of a Solid-State Imaging Device

Figure 3:
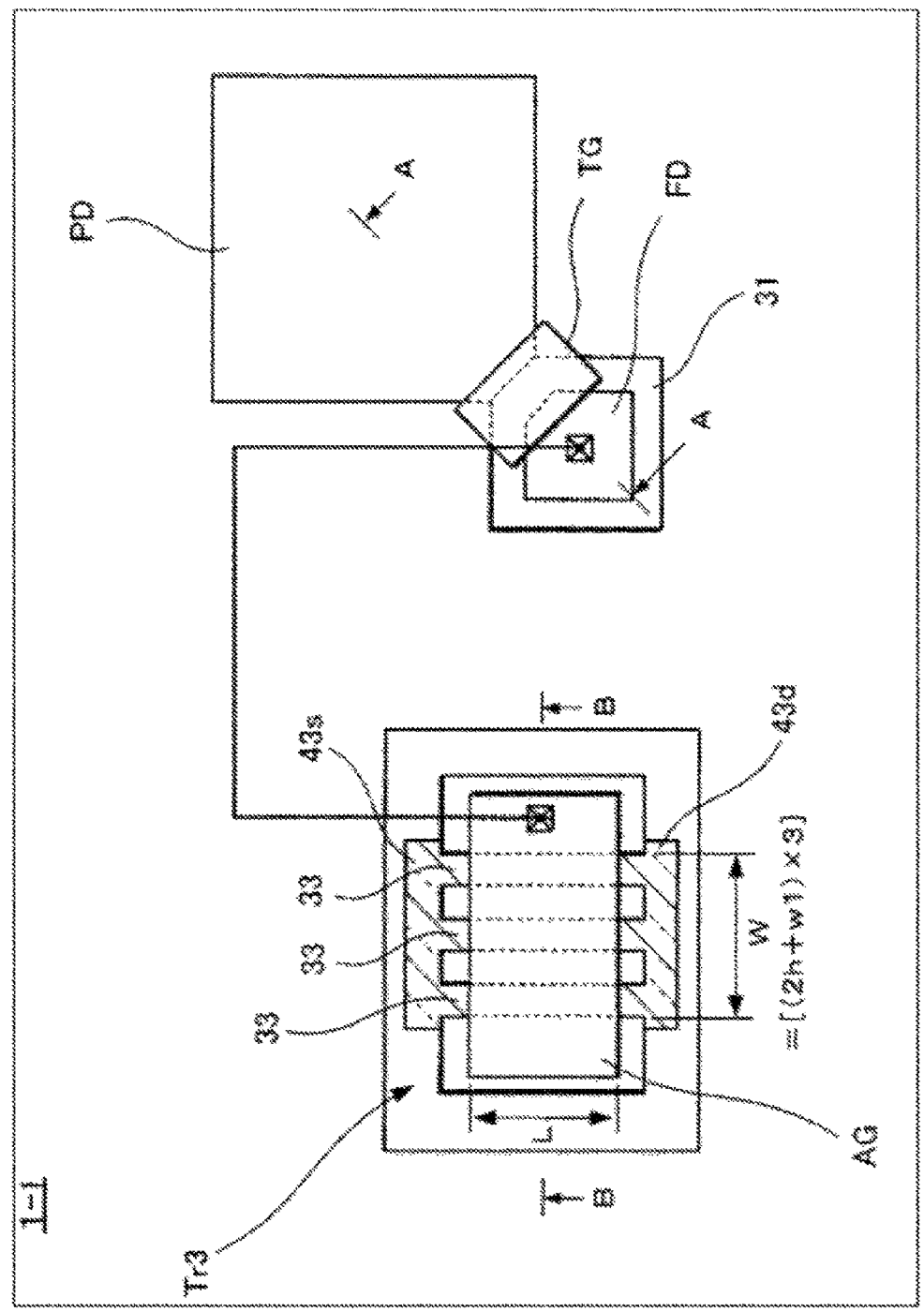
FIG. 3 is a schematic plan view of principal components in the structure of a solid-state imaging device according to a first embodiment.
Figure 4:
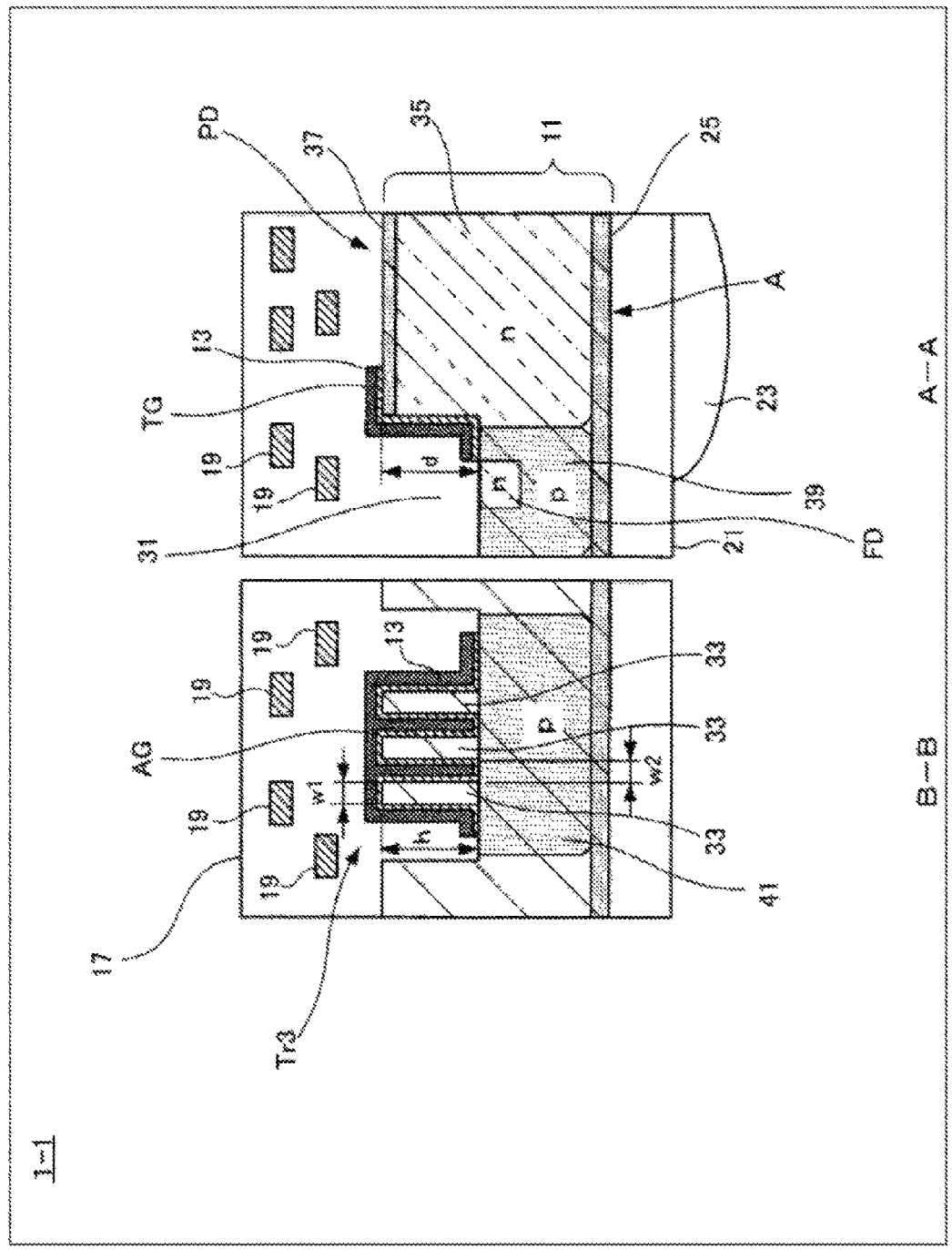
FIG. 4 is a cross-sectional view of the principal components in the structure of the solid-state imaging device according to the first embodiment.

Example Including a Fully-Depleted Amplifying Transistor and a Sidewall Transfer Gate FIG. 3 is a schematic plan view of principal components in the structure of a solid-state imaging device 1-1 according to a first embodiment. FIG. 4 shows cross-sections that are taken along the A-A section line and the B-B section line defined in FIG. 3. FIGS. 3 and 4 show the portions that are equivalent to the portions from the photodiode PD to the floating diffusion FD and the portion of the amplifying transistor Tr3 shown in FIG. 2. Referring to those drawings, the structure of the solid-state imaging device 1-1 according to the first embodiment is described below.

As shown in FIGS. 3 and 4, the solid-state imaging device 1-1 according to the first embodiment has a photodiode PD forming a photoelectric conversion unit in a semiconductor layer 11. Gate electrodes including a transfer gate TG and the amplifier gate AG of the amplifying transistor Tr3 are placed on a principal plane (surface) of the semiconductor layer 11 via a gate insulating film 13. An interconnect layer in which interconnects 19 insulated by an interlayer insulating film 17 are stacked to form a multilayer film is placed over the upper layers of those gate electrodes.

The other principal plane of the semiconductor layer 11 serves as a light receiving surface A for the photodiode PD, and optical layers such as color filters (not shown) and an on-chip lens 23 are placed on the light receiving surface A via a protective insulating film 21. With this structure, the solid-state imaging device 1-1 is of a back-illuminated type, having the light receiving surface A in the principal plane on the opposite side from the interconnect layer.

The respective components will be described below in detail in the following order: the semiconductor layer 11, the photodiode PD forming a photoelectric conversion unit, the floating diffusion FD, the transfer gate TG, and the amplifying transistor Tr3.

[Semiconductor Layer 11]

The semiconductor layer 11 is formed with an intrinsic semiconductor of single-crystal silicon, for example, and the entire surface of the light receiving surface A is covered with an interface region 25 formed by introducing a p-type impurity into the semiconductor layer 11. On the surface on the opposite side of the semiconductor layer 11 from the light receiving surface A, concave portions 31 adjacent to the respective photodiodes PD are formed. On the surface of the semiconductor layer 11, convex strips 33 are arranged in parallel in the formation region of the amplifying transistor Tr3. In this example, three convex strips 33 are arranged in parallel.

The respective convex strips 33 are formed by removing the portions around the respective convex strips 33 in the semiconductor layer 11. The height h of the convex strips 33 is the same as the depth d of the concave portions 31, and the steps formed by the convex strips 33 may be equal to the steps formed by the concave portions 31. Each of the convex strips 33 has a predetermined width w1 in a direction perpendicular to the extending direction thereof.

In a case where two or more photodiodes PD share one pixel drive circuit that includes a floating diffusion FD and an amplifying transistor Tr3, one concave portion 31 is formed adjacent to the two or more photodiodes PD.

[Photodiode (Photoelectric Conversion Unit) PD]

The photodiode PD forming a photoelectric conversion unit is formed with the pn junction between a charge storage region 35 that is an n-type impurity region in the semiconductor layer 11 and a p-type impurity region in contact with the charge storage region 35. In this example, the n-type charge storage region 35 is provided between the p-type interface region 25 located on the side of the light receiving surface A of the semiconductor layer 11 and a p-type interface region 37 formed on the surface layer of the semiconductor layer 11 on the opposite side from the p-type interface region 25. The pn junction between those regions forms the photodiode PD.

Such a photodiode PD is provided in such a manner that the charge storage region 35 is exposed through a sidewall of the concave portion 31 of the semiconductor layer 11. The charge storage region 35 is preferably also exposed through the bottom portion of the concave portion 31. Accordingly, the portion of the charge storage region 35 closer to the light receiving surface A than to the bottom portion of the concave portion 31 can also be easily affected by the charges from the transfer gate TG.

[Floating Diffusion FD]

The floating diffusion FD is the portion from which charges stored in the charge storage region 35 of the photodiode PD are read by an operation of the transfer gate TG. Such a floating diffusion FD is surrounded by a p-type well region 39 exposed through the bottom portion of the concave portion 31, and faces the bottom portion of the concave portion 31. The p-type well region 39 is in contact with the n-type charge storage region 35 forming the photodiode PD. Accordingly, the p-type well region 39 is located between the floating diffusion FD and the n-type charge storage region 35. The p-type well region 39 is designed to reach the p-type interface region 25 formed on the side of the light receiving surface A of the semiconductor layer 11.

[Transfer Gate TG]

The transfer gate TG is the gate electrode for reading out the charges stored in the charge storage region 35 of the photodiode PD to the floating diffusion FD. Such a transfer gate TG is designed to extend along a sidewall of the concave portion 31 to which the charge storage region 35 of the photodiode PD is exposed via the gate insulating film 13, and is formed as a "sidewall transfer gate". More specifically, the transfer gate TG is designed to extend from the surface of the semiconductor layer 11 to a sidewall of the concave portion 31, and further extend from the sidewall of the concave portion 31 to the bottom portion of the concave portion 31. At the bottom portion of the concave portion 31, the transfer gate TG is provided on the well region 39, and the floating diffusion FD is exposed through the transfer gate TG. Such a transfer gate TG is made of polysilicon, for example.

[Amplifying Transistor Tr3]

The amplifying transistor Tr3 is a transistor connected to the floating diffusion FD, and is characteristically formed as a transistor of a fully-depleted type in this example. Such an amplifying transistor Tr3 has a channel that is formed with convex strips 33 arranged in parallel. The amplifying transistor Tr3 also includes a gate electrode (or the amplifier gate AG) extending in a direction perpendicular to those convex strips 33. In the amplifying transistor Tr3, a source 43s and a drain 43d formed with n-type impurity regions are further provided at both sides of the amplifier gate AG in the extending direction of the convex strips 33.

Here, each of the convex strips 33 constituting the channel is designed to function as a transistor of a fully-depleted type by adjusting the width w1 in the direction perpendicular to the extending direction thereof and the impurity density in the portion of the convex strip 33. The width w1 of each of the convex strips 33 is on the order of several tens of nm, for example. A p-type well region 41 is formed in the portion of the semiconductor layer 11 located under the convex strips 33. The impurity density in the convex strips 33 is such that the amplifying transistor Tr3 can function as a transistor of a fully-depleted type, and a low-density channel impurity may be contained as an impurity. In view of this, as long as the amplifying transistor Tr3 can function as a transistor of a fully-depleted type, the convex strips 33 may be formed with so-called "intrinsic semiconductor" portions, and constitute an intrinsic channel.

In such an amplifying transistor Tr3, the length of the portion in which the amplifier gate AG is placed along the convex strips 33 in the direction perpendicular to the extending direction of the convex strips 33 is the channel width W. That is, the channel width W is calculated as $W=(2\times h+w1)\times 3$], where h represents the height and w1 represents the width of each of the convex strips 33, and the number of the convex strips 33 is three.

In the example shown in the drawing, the convex strips 33 are formed on the well region 41. However, the well region 41 may exist inside the convex strips 33 at the lower portions of the convex strips 33, so that device separation of the amplifying transistor Tr3 is assured. In this case, the portions of the convex strips 33 minus the well region 41 serve as the channel. Therefore, the height h of the convex strips 33 related to the channel width W becomes smaller by the height of the well region 41 existing in the convex strips 33.

If leakage current is ignorable, a space may be formed between the well region 41 and the convex strips 33, so as to increase the channel width W of the amplifying transistor Tr3. In this case, the width w2 between each two convex strips 33 and the extension width of the amplifier gate AG at either end of the convex strips 33 are added to the channel width W.

In the amplifying transistor Tr3, the width L of the amplifier gate AG in the extending direction of the convex strips 33 is the channel length L.

The amplifying transistor Tr3 described above has its amplifier gate AG connected to the floating diffusion FD via the interconnects 19 and connection holes not shown in the drawings.

<Effects of the Solid-State Imaging Device According to the First Embodiment>

In the solid-state imaging device 1-1 described above, a fully-depleted structure that functions as a transistor even if the impurity density in the channel portion is low is used as the amplifying transistor Tr3. With this structure, generation of RTS noise due to random dopant fluctuations (RDF) of the channel impurity can be prevented particularly in the miniaturized amplifying transistor Tr3. Accordingly, the amplifying transistor Tr3 can be further miniaturized, and the imaging area in which the amplifying transistor Tr3 is located can be made smaller. As a result, a reduction in size and an increase in the degree of integration can be achieved in the solid-state imaging device 1-1 that uses the amplifying transistor Tr3.

Furthermore, in the solid-state imaging device 1-1 according to the first embodiment, the amplifying transistor Tr3 is designed as a fin structure in which the amplifier gate AG is positioned so as to extend in a direction perpendicular to the convex strips 33 formed in the semiconductor layer 11. In this case, the convex strips 33 serve as the channel portion in the amplifying transistor Tr3. As described above, the channel width W in the amplifying transistor Tr3 is the length of the junction between the convex strips 33 and the amplifier gate AG via the gate insulating film 13 in the direction perpendicular to the convex strips 33. Accordingly, the channel width W can be increased in relation to the area occupied by the amplifying transistor Tr3. The effect to increase the channel width W is greater where the number of the convex strips 33 to which the amplifier gate AG extends perpendicularly is larger. Accordingly, the area occupied by the amplifying transistor Tr3 can be made smaller with respect to the set value of the channel width W required for the amplifying transistor Tr3.

Further, in the amplifying transistor Tr3 of the fully-depleted type, the conversion efficiency is increased as the amplifier gain is increased. Accordingly, the amplifying transistor Tr3 can be miniaturized in relation to the required conversion efficiency.

With the above characteristics, the imaging area can be made smaller, and a reduction in size and an increase in the degree of integration can be achieved in the solid-state imaging device 1-1.

Also, in the solid-state imaging device 1-1 according to the first embodiment, the transfer gate TG is placed along a sidewall of the concave portion 31 through which the charge storage region 35 of the photodiode PD is exposed, so that charges collected from a wider area in the charge storage region 35 are transferred to the floating diffusion FD. Furthermore, the floating diffusion FD is provided in the bottom portion of the concave portion 31, so that the potential gradient between the n-type charge storage region 35 and the floating diffusion FD is easily formed. Accordingly, a charge flow reversal from the floating diffusion FD to the charge storage region 35 can be certainly prevented. Also, an impurity can be introduced into the transfer gate TG made of polysilicon by ion implantation from an oblique direction. Therefore, depletion of the transfer gate TG can also be prevented. With the above characteristics, the efficiency of charge transfer from the charge storage region 35 to the floating diffusion FD can be increased.

<Method of Manufacturing the Solid-State Imaging Device>

Referring now to the cross-sectional process diagrams shown in FIGS. 5 through 8, a method of manufacturing the solid-state imaging device 1-1 having the above described structure is described.

Figure 5:
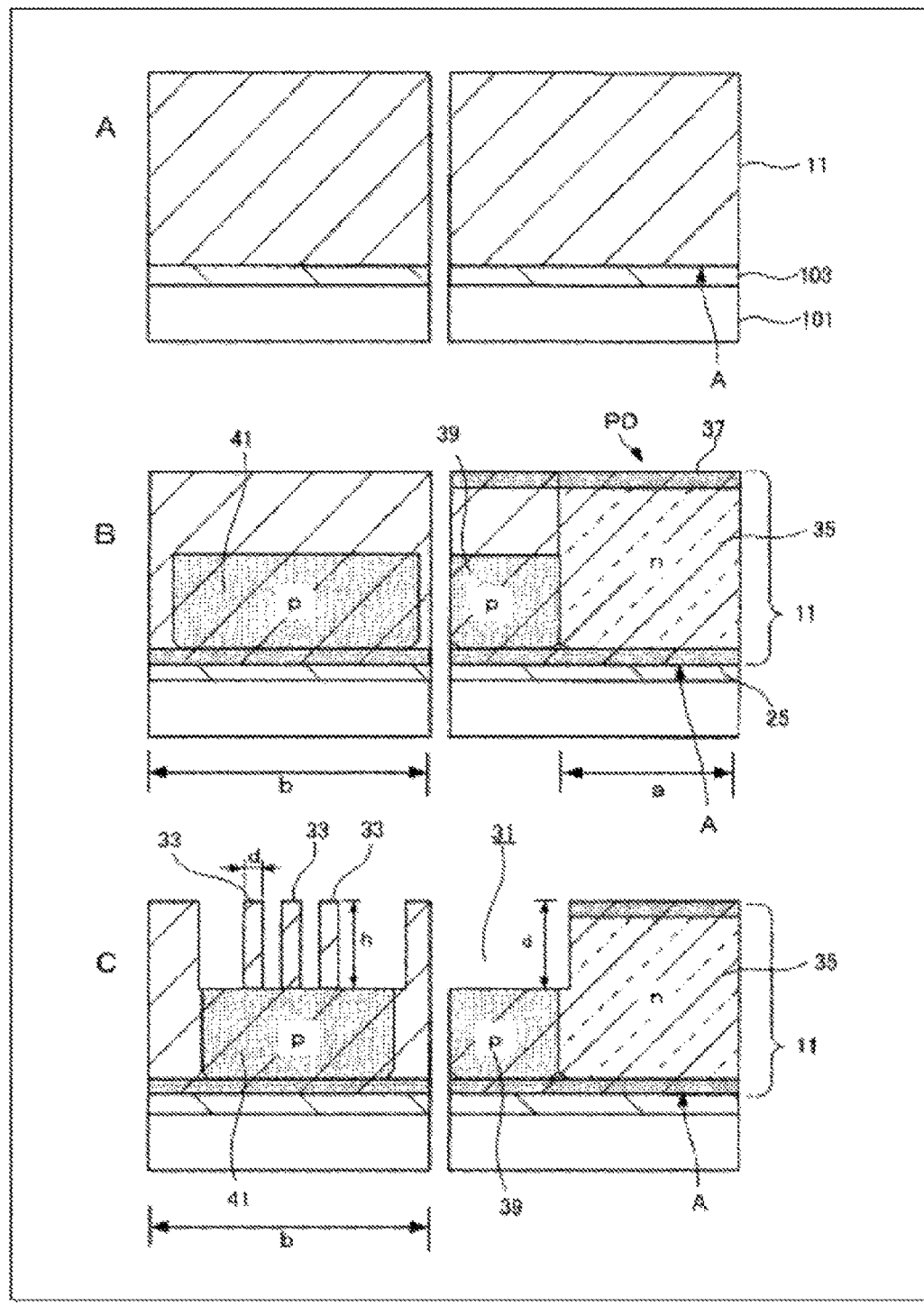
FIG. 5 is a (first) diagram showing the process for manufacturing the solid-state imaging device according to the first embodiment.

[A of FIG. 5]

First, as shown in A of FIG. 5, a SOI (silicon on insulator) substrate having the semiconductor layer 11 formed thereon via an oxide film 103 is prepared on a supporting substrate 101. The oxide film 103 is made of silicon oxide, for example, and the semiconductor layer 11 is made of an intrinsic semiconductor of silicon. The face of the semiconductor layer 11 facing the oxide film 103 is the light receiving surface A. The face on the opposite side from the light receiving surface A is the surface.

[B of FIG. 5]

As shown in B of FIG. 5, the interface region 25 having a p-type impurity implanted therein is formed on the entire surface of the interface layer on the side of the light receiving surface A of the semiconductor layer 11. The interface region 37 having a p-type impurity implanted therein is formed in a position including the photodiode formation region a in the surface layer on the opposite side of the semiconductor layer 11 from the light receiving surface A. At this point, the p-type interface region 37 is not formed in the amplifying transistor formation region b.

Further, the charge storage region 35 having an n-type impurity implanted therein is formed between the p-type interface region 25 and the p-type interface region 37 in the photodiode formation region a in the semiconductor layer 11, to obtain the photodiode PD. The well region 39 having a p-type impurity implanted therein is formed adjacent to the charge storage region 35 and the interface region 25 in a deep region on the side of the light receiving surface A of the semiconductor layer 11. In the same procedure as above, the well region 41 having a p-type impurity implanted therein is also formed adjacent to the interface region 25 in the amplifying transistor formation region b in the semiconductor layer 11 and in a deep region on the side of the light receiving surface A of the semiconductor layer 11.

The regions having the respective impurities implanted therein are formed by using ion implantation followed by annealing, and, if necessary, epitaxial growth. However, the regions may be formed by ion implantation in any order. Also, the ion implantation for forming the interface region 37, the n-type charge storage region 35, and the well regions 39 and 41 is performed with respective resist patterns serving as masks.

[C of FIG. 5]

As shown in C of FIG. 5, the concave portion 31 and the convex strips 33 are formed on the surface layer on the opposite side of the semiconductor layer 11 from the light receiving surface A in a single procedure. The concave portion 31 is formed in such a position that the n-type charge storage region 35 is exposed through a sidewall thereof, and has such a depth d that the well region 39 is exposed through the bottom portion.

In the amplifying transistor formation region b, the convex strips 33 are formed to have a height h (=d) by removing the intrinsic semiconductor portions surrounding the convex strips 33 in the semiconductor layer 11. In this situation, the convex strips 33 may penetrate into the well region 41. Also, a space may be formed between the convex strips 33 and the well region 41, as long as leakage current is ignorable. In a case where a space is formed between the convex strips 33 and the well region 41, however, the well region 39 is not exposed through the bottom portion of the concave portion 31 formed in the same procedure as the convex strips 33. Therefore, a p-type impurity is selectively implanted into the bottom portion of the concave portion 31, so that the well region 39 is formed to face the bottom portion of the concave portion 31.

The concave portion 31 and the convex strips 33 described above are formed by anisotropic etching, with a resist pattern being used as a mask.

Figure 6:
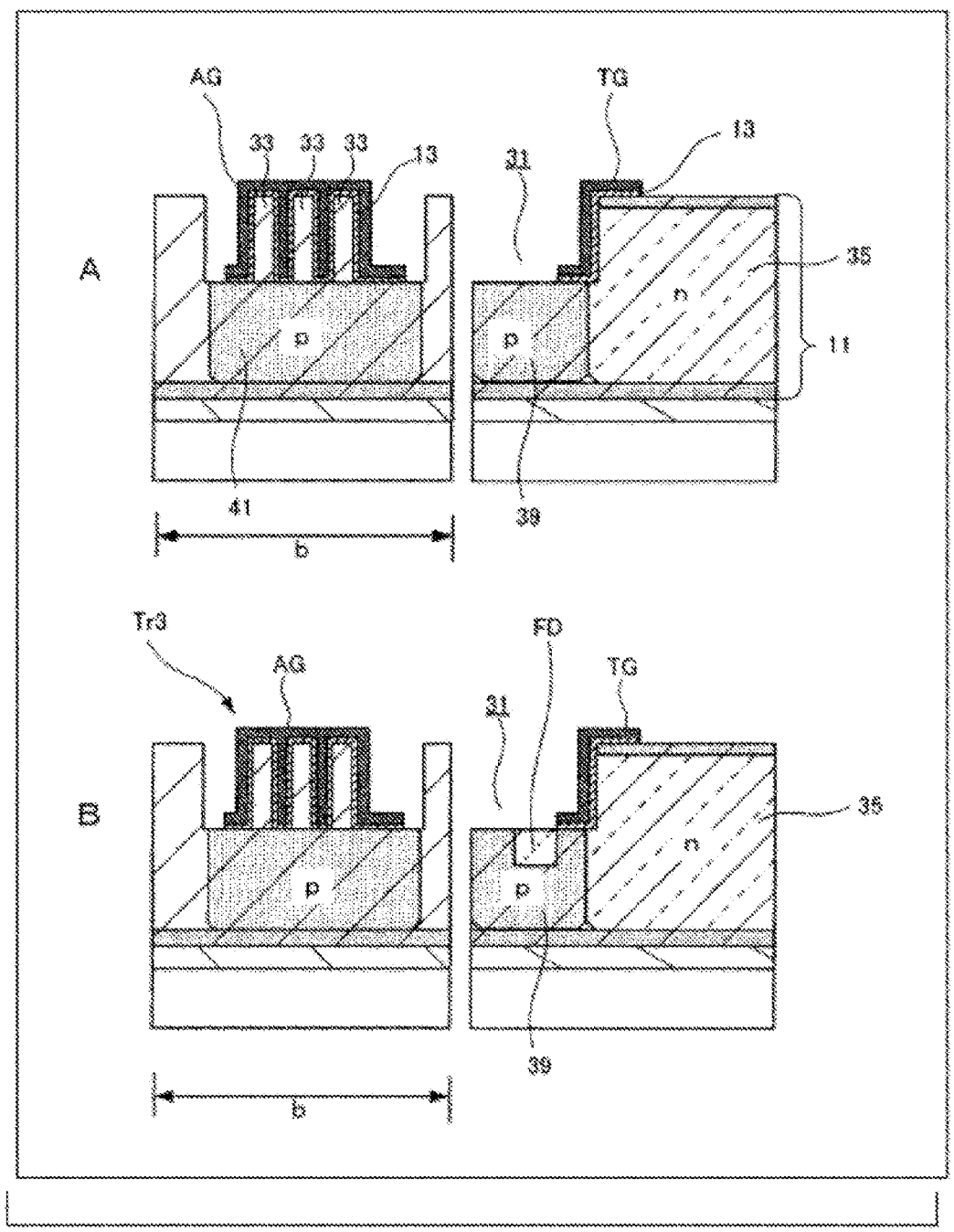
FIG. 6 is a (second) diagram showing the process for manufacturing the solid-state imaging device according to the first embodiment.

[A of FIG. 6]

As shown in A of FIG. 6, the transfer gate TG is formed along the sidewall of the concave portion 31 through which the charge storage region 35 of the photodiode PD is exposed, and the amplifier gate AG extending in the direction perpendicular to the convex strips 33 is formed in the amplifying transistor formation region b. In this procedure, the gate insulating film 13 is first formed on the exposed surface of the semiconductor layer 11 by thermal oxidation, and a gate electrode film made of polysilicon, for example, is formed on the gate insulating film 13. Patterning is then performed on the gate electrode film and the gate insulating film 13 by anisotropic etching using a resist pattern as a mask, to obtain the transfer gate TG and the amplifier gate AG.

[B of FIG. 6]

As shown in B of FIG. 6, the floating diffusion FD having an n-type impurity implanted therein is then formed in the surface layer of the well region 39 adjacent to the charge storage region 35. In this procedure, the floating diffusion FD is formed by ion implantation followed by annealing, with a resist pattern and the transfer gate TG being used as a mask.

Also, as shown in FIG. 3, the source 43s and the drain 43d that have an n-type impurity implanted therein are formed at the sides of the amplifier gate AG in the amplifying transistor formation region b. In this procedure, the source 43s and the drain 43d are formed by ion implantation followed by annealing, with a resist pattern and the amplifier gate AG being used as a mask. In this manner, the fully-depleted amplifying transistor Tr3 having the convex strips 33 as the channel is obtained.

The formation of the floating diffusion FD and the formation of the source 43s and the drain 43d described above may be performed in a single procedure.

Figure 7:
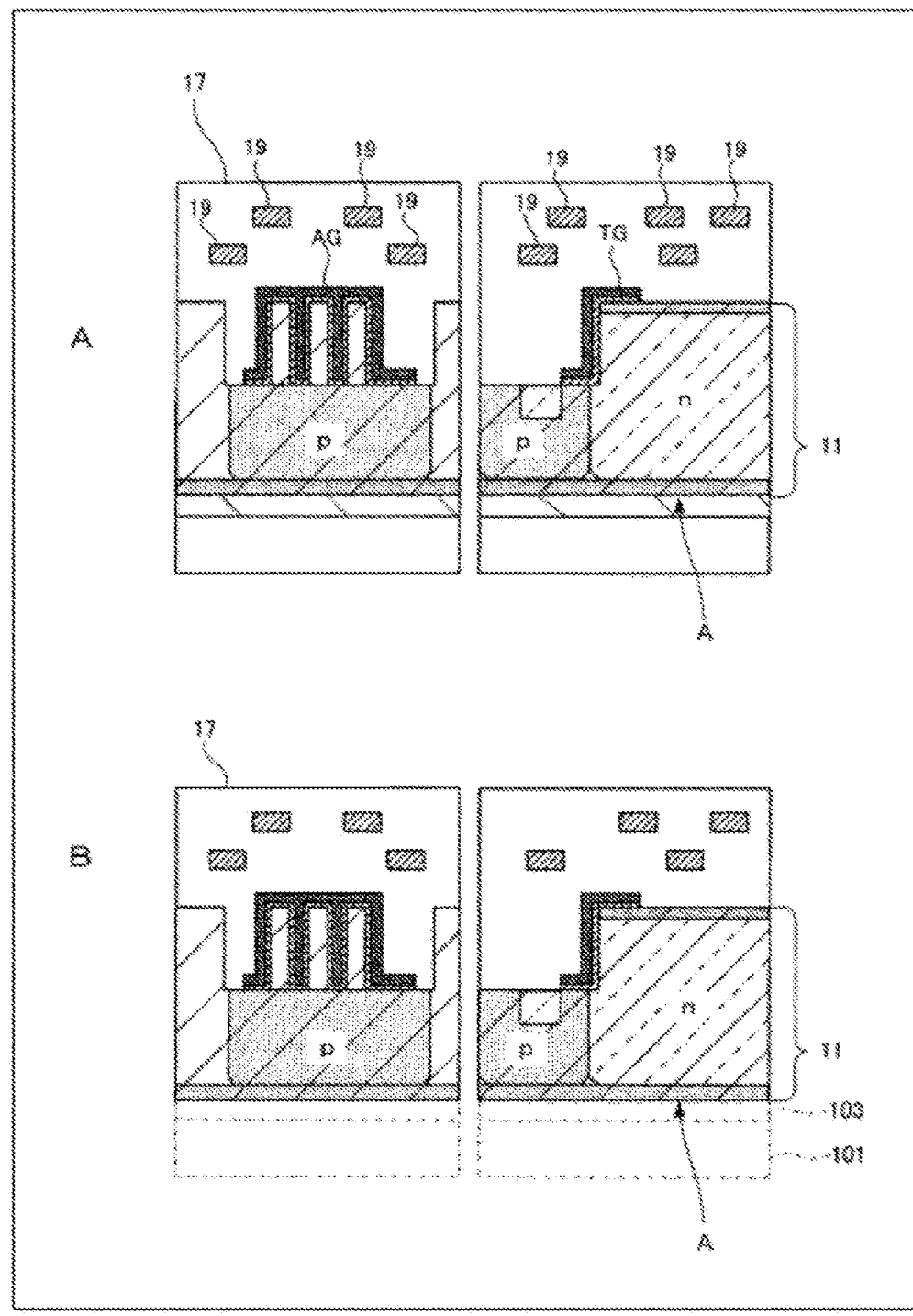
FIG. 7 is a (third) diagram showing the process for manufacturing the solid-state imaging device according to the first embodiment.

[A of FIG. 7]

As shown in A of FIG. 7, a procedure for forming the interlayer insulating film 17 on the semiconductor layer 11 in such a manner as to cover the transfer gate TG and the amplifier gate AG and fill the grooves, a procedure for forming connection holes (not shown) in the interlayer insulating film 17, and a procedure for forming the interconnects 19 on the interlayer insulating film 17 are carried out. After that, those procedures are sequentially repeated, and the procedure for forming the interlayer insulating film 17 is carried out at last. In this manner, the interconnect layer in which the interconnects 19 insulated by the interlayer insulating film 17 are stacked to form a multilayer is formed on the surface on the opposite side of the semiconductor layer 11 from the light receiving surface A.

[B of FIG. 7]

As shown in B of FIG. 7, the supporting substrate 101 and the oxide film 103 are removed from the side of the light receiving surface A of the semiconductor layer 11, to expose the light receiving surface A of the semiconductor layer 11.

[FIG. 4]

After the above procedures, the protective insulating film 21 is formed on the light receiving surface A of the semiconductor layer 11, if necessary, and the on-chip lens 23 is further formed, as shown in FIG. 4. Also, an antireflection film, a light shielding film, and color filter layers not shown in the drawing are formed between the protective insulating film 21 and the on-chip lens 23, if necessary. In this manner, the solid-state imaging device 1-1 is completed.

<Effects of the Manufacturing Method According to the First Embodiment>

By the above described manufacturing method, the convex strips 33 that serve as the channel portion of the amplifying transistor Tr3, and the concave portion 31 in which the transfer gate TG is placed are formed in a single procedure. Also, the amplifier gate AG and the transfer gate TG are formed in a single procedure. Further, the floating diffusion FD, and the source 43s and the drain 43d are formed in a single procedure. Accordingly, the solid-state imaging device 1-1 according to the first embodiment can be obtained in a simpler manner.

3. Second Embodiment

Figure 8:
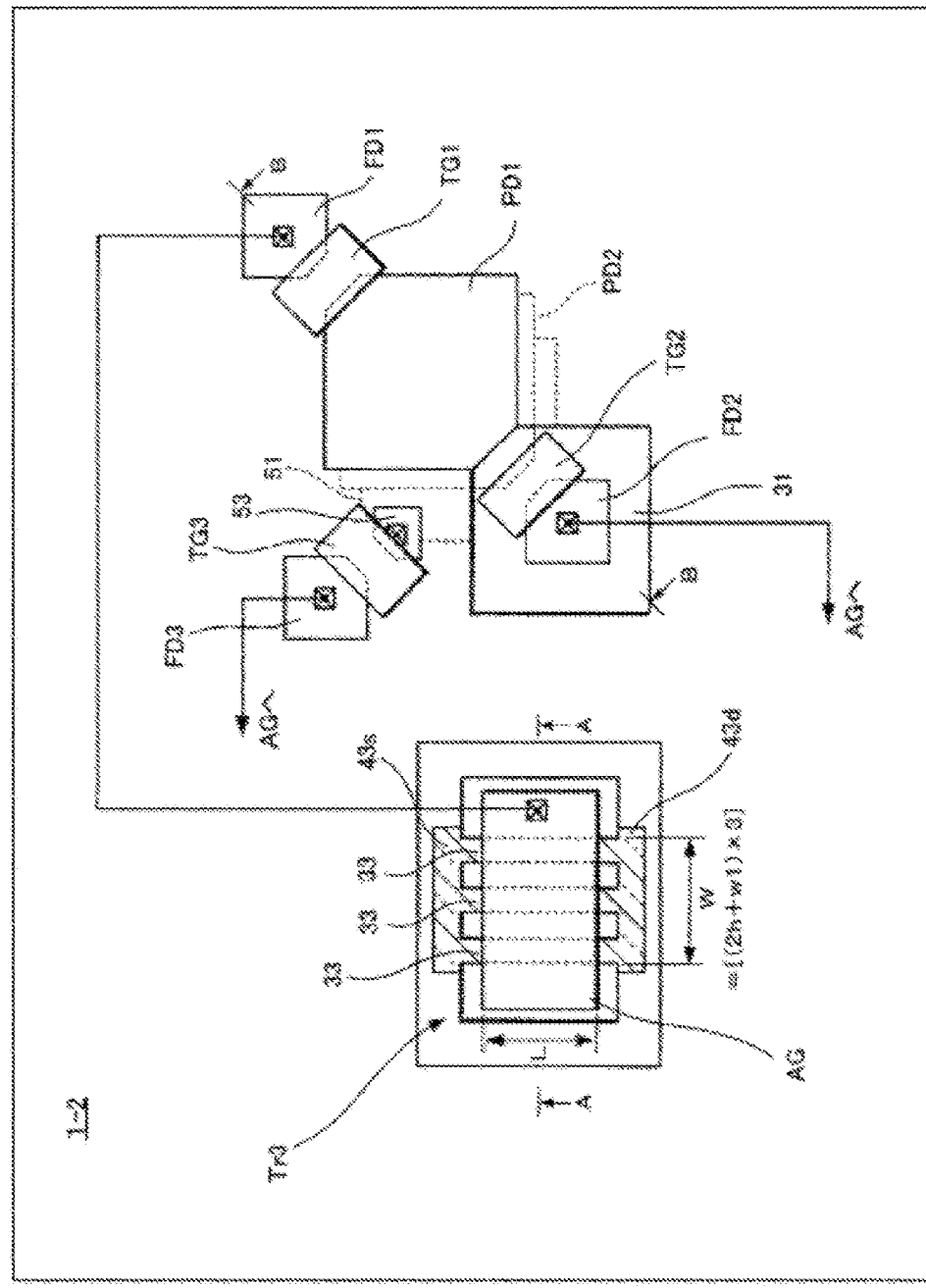
FIG. 8 is a schematic plan view of principal components in the structure of a solid-state imaging device according to a second embodiment.
Figure 9:
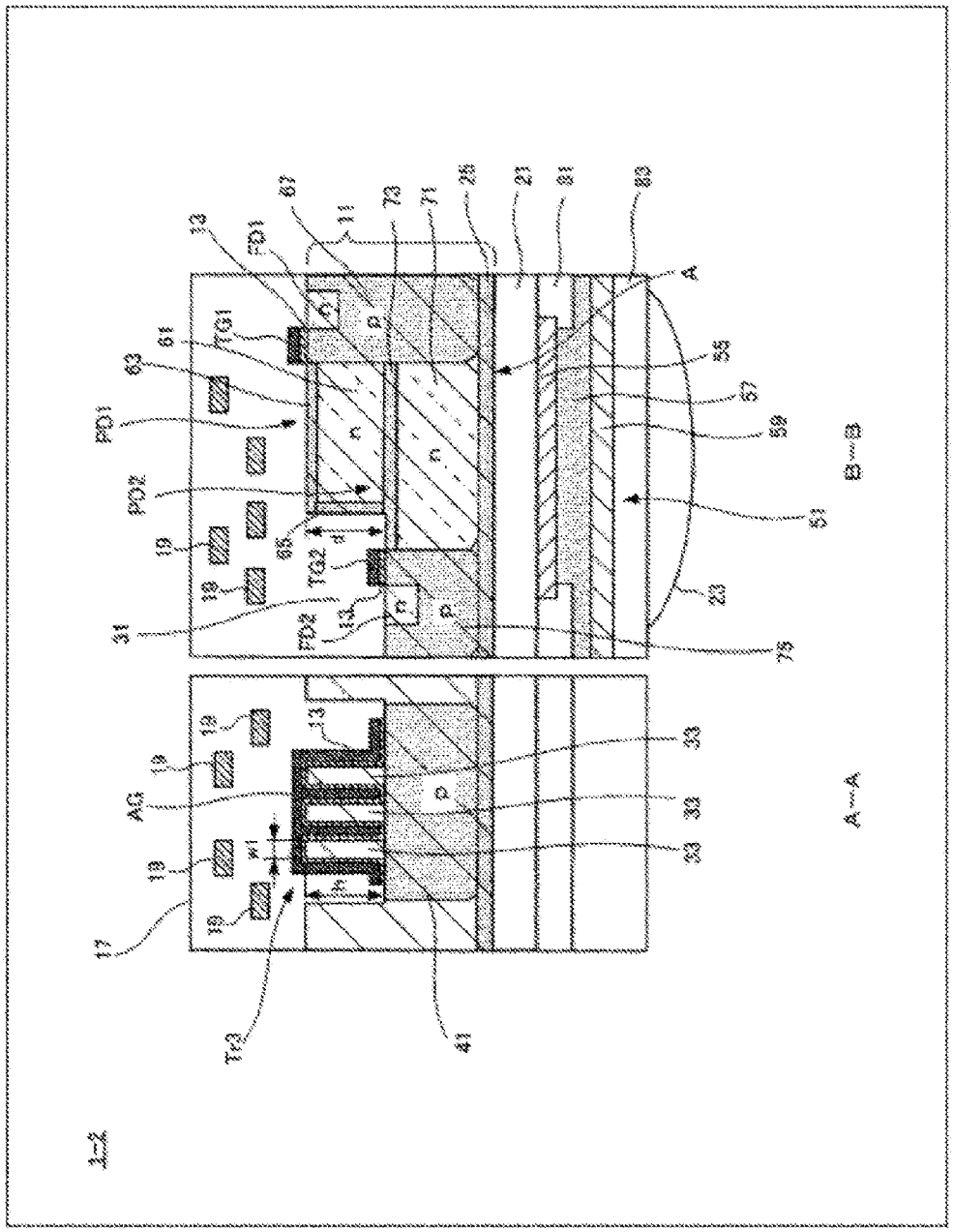
FIG. 9 is a cross-sectional view of the principal components in the structure of the solid-state imaging device according to the second embodiment.

Example Including a Fully-Depleted Amplifying Transistor and a Photoelectric Conversion Unit with a Stack Structure FIG. 8 is a schematic plan view of principal components in the structure of a solid-state imaging device 1-2 according to a second embodiment. FIG. 9 shows cross-sections that are taken along the A-A section line and the B-B section line defined in FIG. 8. FIGS. 8 and 9 show the portions that are equivalent to the portions from the photodiode PD formed as a photoelectric conversion unit to the floating diffusion FD, and the portion of the amplifying transistor Tr3.

As shown in FIGS. 8 and 9, in the solid-state imaging device 1-2 according to the second embodiment, an exposed photodiode PD1 and an embedded photodiode PD2 are stacked and provided as a photoelectric conversion unit in a semiconductor layer 11. These photodiodes PD1 and PD2 are used as a photoelectric conversion unit for light with different wavelength ranges from each other. Gate electrodes including transfer gates TG1 and TG2, and the amplifier gate AG of an amplifying transistor Tr3 are placed on a principal plane (surface) of the semiconductor layer 11 via a gate insulating film 13, as in the first embodiment. An interconnect layer in which interconnects 19 insulated by an interlayer insulating film 17 are stacked to form a multilayer film is placed over the upper layers of those gate electrodes.

The other principal plane of the semiconductor layer 11 serves as a light receiving surface A for the photodiodes PD1 and PD2. On the light receiving surface A, another photoelectric conversion unit 51 is provided in such a manner as to be stacked on the two photodiodes PD1 and PD2 via a protective insulating film 21. This photoelectric conversion unit 51 is used as a photoelectric conversion unit for light with a different wavelength range from those of the above described photodiodes PD1 and PD2.

On the light receiving surface A, an on-chip lens 23 and the like are provided as in the first embodiment, if necessary, in such a manner as to cover the photoelectric conversion unit 51. However, there is no need to provide color filters between the photoelectric conversion unit 51 and the on-chip lens 23. With this structure, the solid-state imaging device 1-2 is of a back-illuminated type, having the light receiving surface A in the principal plane on the opposite side from the interconnect layer.

The respective components will be described below in detail in the following order: the semiconductor layer 11, the exposed photodiode PD1, the embedded photodiode PD2, the photoelectric conversion unit 51, and the amplifying transistor Tr3.

[Semiconductor Layer 11]

The semiconductor layer 11 is made of n-type single-crystal silicon, for example, and the entire surface of the light receiving surface A is covered with an interface region 25 formed by introducing a p-type impurity into the semiconductor layer 11. On the surface on the opposite side of the semiconductor layer 11 from the light receiving surface A, concave portions 31 adjacent to the exposed photodiode PD1 are formed. On the surface of the semiconductor layer 11, convex strips 33 are arranged in parallel in the formation region of the amplifying transistor Tr3. These convex strips 33 are the same as those of the first embodiment, having a height h that is equal to the depth d of the concave portions 31, and a predetermined width w1 in a direction perpendicular to the extending direction thereof.

[Exposed Photodiode (Photoelectric Conversion Unit) PD1]

The exposed photodiode PD1 forming a photoelectric conversion unit is a photoelectric conversion unit for light in the wavelength range of red, for example. This photodiode PD1 is formed with the pn junction between a charge storage region 61 that is an n-type impurity region formed in the semiconductor layer 11 and a p-type impurity region in contact with the charge storage region 61. In this example, the n-type charge storage region 61 is in contact with a p-type interface region 63 formed in the surface layer on the opposite side of the semiconductor layer 11 from the light receiving surface A, and a p-type interface region 65 formed on a sidewall side of the concave portion 31. The pn junction between those regions forms the photodiode PD1.

A floating diffusion FD1 is formed near the photodiode PD1. The floating diffusion FD1 is the portion from which charges stored in the charge storage region 61 of the photodiode PD1 are read by an operation of the transfer gate TG1. Such a floating diffusion FD1 is formed in the surface layer of the semiconductor layer 11 in such a manner as to be surrounded by a p-type well region 67 located adjacent to the charge storage region 61. In this situation, the p-type well region 67 is located between the floating diffusion FD1 and the n-type charge storage region 61. The p-type well region 67 is designed to reach the p-type interface region 25 formed on the side of the light receiving surface A of the semiconductor layer 11.

The transfer gate TG1 for reading out the charges stored in the charge storage region 61 of the photodiode PD1 to the floating diffusion FD1 is provided between the photodiode PD1 and the floating diffusion FD1. Such a transfer gate TG1 is placed on the portion of the well region 67 located between the charge storage region 61 and the floating diffusion FD1 via the gate insulating film 13.

[Embedded Photodiode (Photoelectric Conversion Unit) PD2]

The exposed photodiode PD2 forming a photoelectric conversion unit is a photoelectric conversion unit for light in the wavelength range of blue, for example. In this photodiode PD2, an n-type impurity region stacked on the n-type charge storage region 61 forming the photodiode PD1 serves as a charge storage region 71 in the semiconductor layer 11. In this example, the n-type charge storage region 71 is stacked on the n-type charge storage region 61 via a separation region 73 formed with a p-type impurity region. The n-type charge storage region 71 is also located in contact with the p-type interface region 25 formed on the side of the light receiving surface A of the semiconductor layer 11. The pn junction between those regions forms the photodiode PD2.

Such a photodiode PD2 is designed to protrude toward the bottom face side of the concave portion 31 of the semiconductor layer 11. In this case, in the bottom face of the concave portion 31, the n-type charge storage region 71 is covered with the p-type separation region 73.

A floating diffusion FD2 is formed near the photodiode PD2. The floating diffusion FD2 is the portion from which charges stored in the charge storage region 71 of the photodiode PD2 are read by an operation of the transfer gate TG2. Such a floating diffusion FD2 is surrounded by a p-type well region 75 exposed through the bottom portion of the concave portion 31, and faces the bottom portion of the concave portion 31. The p-type well region 75 is in contact with the n-type charge storage region 71 forming the photodiode PD2.

Accordingly, the p-type well region 75 is located between the floating diffusion FD2 and the n-type charge storage region 71. The p-type well region 75 is designed to reach the p-type interface region 25 formed on the side of the light receiving surface A of the semiconductor layer 11.

The transfer gate TG2 for reading out the charges stored in the charge storage region 71 of the photodiode PD2 to the floating diffusion FD2 is also provided between the photodiode PD2 and the floating diffusion FD2. Such a transfer gate TG2 is placed on the portion of the well region 75 located between the charge storage region 71 and the floating diffusion FD2 via the gate insulating film 13.

[Photoelectric Conversion Unit 51]

The photoelectric conversion unit 51 is a photoelectric conversion unit for light in the wavelength range of green, for example. On the light receiving surface A of the semiconductor layer 11, the photoelectric conversion unit 51 is provided in such a manner as to be stacked on the photodiodes PD1 and PD2 via the protective insulating film 21. This photoelectric conversion unit 51 includes pixel electrodes 55 formed on the protective insulating film 21 by patterning, a photoelectric conversion film 57 formed on the pixel electrode 55, and a shared electrode 59 further formed on the photoelectric conversion film 57, and is formed at the portion where the photoelectric conversion film 57 is interposed between the pixel electrodes 55 and the shared electrode 59.

Among those components, the pixel electrodes 55 are formed with a transparent conductive film that has been subjected to patterning so as to be divided on a pixel-by-pixel basis.

The photoelectric conversion film 57 is made of an organic photoelectric conversion material that photoelectrically converts light of a target wavelength. The organic photoelectric conversion material that photoelectrically converts light of the wavelength of green may be an organic photoelectric conversion material that contains a rhodamine dye, a merocyanine dye, or quinacridone, for example. The organic photoelectric conversion material that photoelectrically converts light of the wavelength of red may be an organic photoelectric conversion material that contains a phthalocyanine dye. The organic photoelectric conversion material that photoelectrically converts light of the wavelength of blue may be an organic photoelectric conversion material that contains a coumarin dye, tris-8-hydroxyquinoline Al (Alq3), or a merocyanine dye, for example. The photoelectric conversion film 57 made of such a material may be formed as a layer shared among all the pixels, or may be formed in a pattern that is divided on a pixel-by-pixel basis.

The shared electrode 59 is formed with a transparent conductive film, may be designed as a layer to be shared among all the pixels, and is connected to a fixed potential. This shared electrode 59 may be formed in a pattern that is divided on a pixel-by-pixel basis. This shared electrode 59 may also be extended to the side of the surface of the semiconductor layer 11 by a plug not shown in the drawings, and be connected to a fixed potential via the interconnects 19 provided on the surface side.

In the photoelectric conversion unit 51 having the above described structure, each of the pixel electrodes 55 is extended to the opposite surface side of the semiconductor layer 11 from the light receiving surface A by a plug not shown in the drawings, and is in contact with another n-type charge storage region 53 shown only in the plan view in FIG. 8. The plugs may be formed with impurity regions, and in this case, are of the n-type, which is the same as the type of the charge storage region 53.

Although shown only in the schematic plan view in FIG. 8, another floating diffusion FD3 located near the charge storage region 53 is formed in the surface layer of the semiconductor layer 11. The floating diffusion FD3 is the portion from which charges extracted from the lower electrode of the photoelectric conversion unit 51 and stored in the charge storage region 53 are read by an operation of a transfer gate TG3. Such a floating diffusion FD3 is formed in the surface layer of the semiconductor layer 11 in such a manner as to be surrounded by a p-type well region (not shown) located adjacent to the charge storage region 53. In this situation, the p-type well region is located between the floating diffusion FD3 and the n-type charge storage region 53.

The transfer gate TG3 for reading out the charges stored in the charge storage region 53 to the floating diffusion FD3 is provided between the charge storage region 53 and the floating diffusion FD3. Such a transfer gate TG3 is placed on the portion of the well region located between the charge storage region 53 and the floating diffusion FD3 via a gate insulating film. Alternatively, the charge storage region 53, the floating diffusion FD3, and the transfer gate TG3 may be located in the bottom portion of the concave portion 31.

[Amplifying Transistor Tr3]

The amplifying transistor Tr3 is a transistor that is connected to the respective floating diffusions FD1, FD2, and FD3. As in the first embodiment, the amplifying transistor Tr3 used in this embodiment is characteristically formed as a transistor of a fully-depleted type, and has the same structure as that of the first embodiment. Therefore, detailed explanation thereof is not repeated herein.

The amplifying transistor Tr3 described above has its amplifier gate AG connected to the floating diffusions FD1, FD2, and FD3 via the interconnects 19 and connection holes not shown in the drawings. The connections between the amplifying transistor Tr3 and the floating diffusions FD1, FD2, and FD3 may have one-to-one correspondence, or the floating diffusions FD1, FD2, and FD3 may be connected to a single amplifying transistor Tr3. Alternatively, floating diffusions located in different pixels from one another may be connected to a single amplifying transistor Tr3.

<Effects of the Solid-State Imaging Device According to the Second Embodiment>

In the solid-state imaging device 1-2 described above, a fully-depleted structure that functions as a transistor even if the impurity density in the channel portion is low is used as the amplifying transistor Tr3, as in the first embodiment. Accordingly, as in the first embodiment, the amplifying transistor Tr3 can be further miniaturized, and a reduction in size and an increase in the degree of integration can be achieved in the solid-state imaging device 1-2 that uses the amplifying transistor Tr3.

In the solid-state imaging device 1-2 according to the second embodiment, the amplifying transistor Tr3 is also designed as a fin structure in which the amplifier gate AG is positioned so as to extend in the direction perpendicular to the convex strips 33 formed in the semiconductor layer 11. Accordingly, as in the first embodiment, the area occupied by the amplifying transistor Tr3 can be reduced in relation to the set value of the channel width W required for the amplifying transistor Tr3. With that, the imaging area can be made smaller, and a reduction in size and an increase in the degree of integration can be achieved in the solid-state imaging device 1-2.

Furthermore, in the solid-state imaging device 1-2 according to the second embodiment, the photodiodes PD1 and PD2 and the photoelectric conversion unit 51 are provided as photoelectric conversion units for light of different wavelength ranges from one another, and are stacked in one pixel. Accordingly, the photodiodes PD1 and PD2 and the photoelectric conversion unit 51 are located at the depths (heights) corresponding to the respective wavelength ranges, so that wavelength separation can be performed without light loss caused by use of color filters. Thus, higher sensitivity and higher area efficiency can be achieved.

<Method of Manufacturing the Solid-State Imaging Device>

Figure 10:
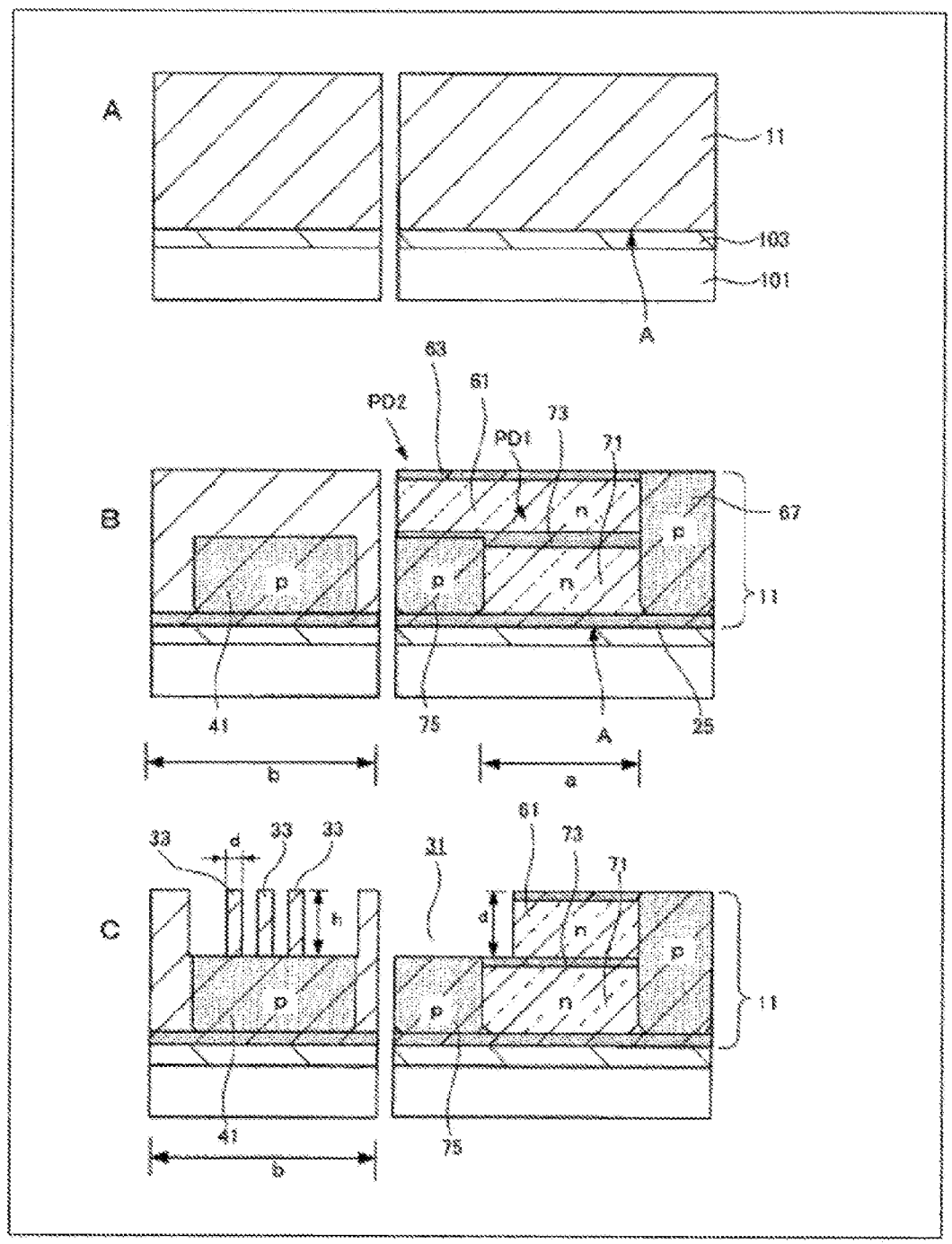
FIG. 10 is a (first) diagram showing the process for manufacturing the solid-state imaging device according to the second embodiment.
Figure 11:
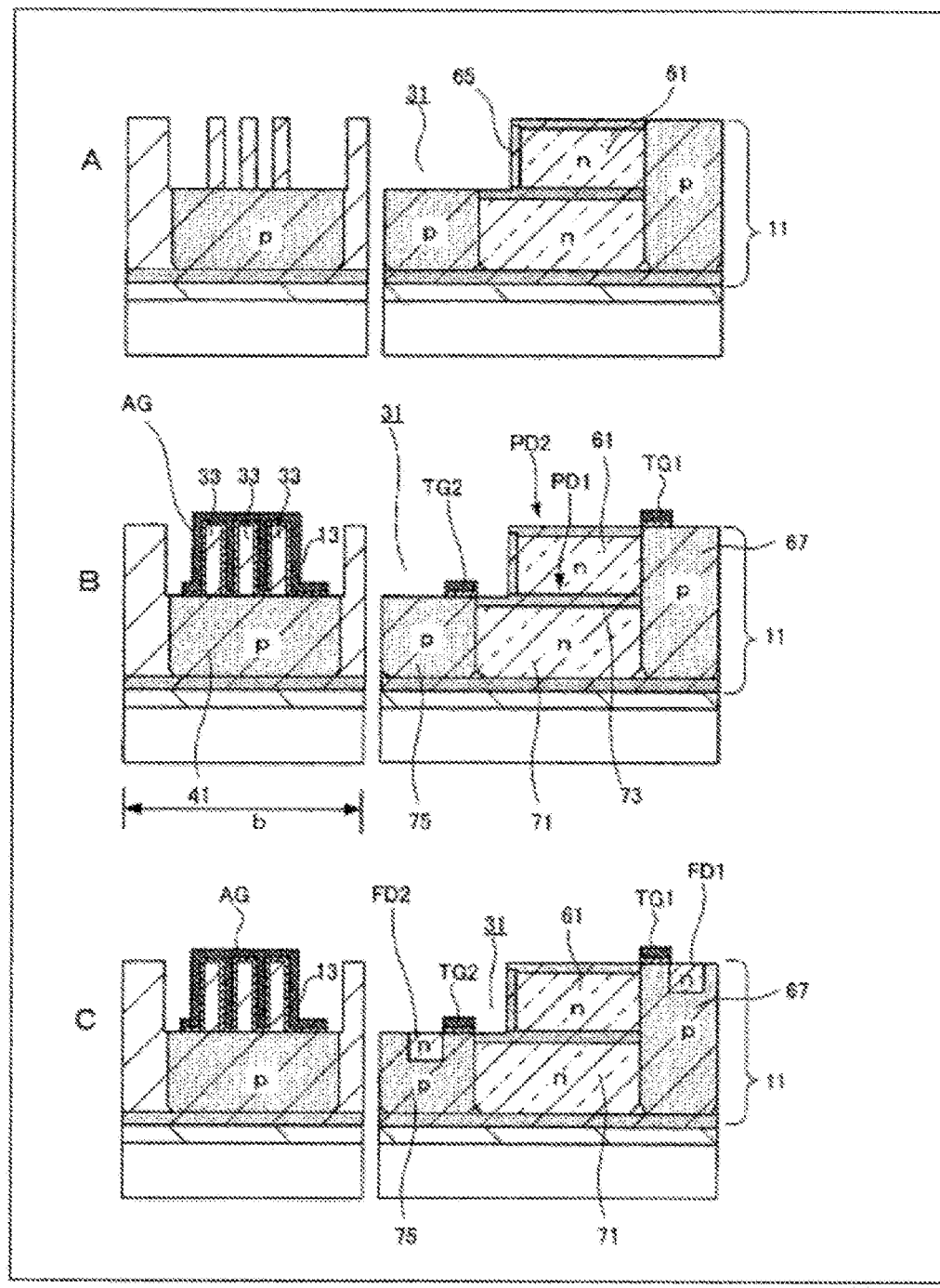
FIG. 11 is a (second) diagram showing the process for manufacturing the solid-state imaging device according to the second embodiment.
Figure 12:
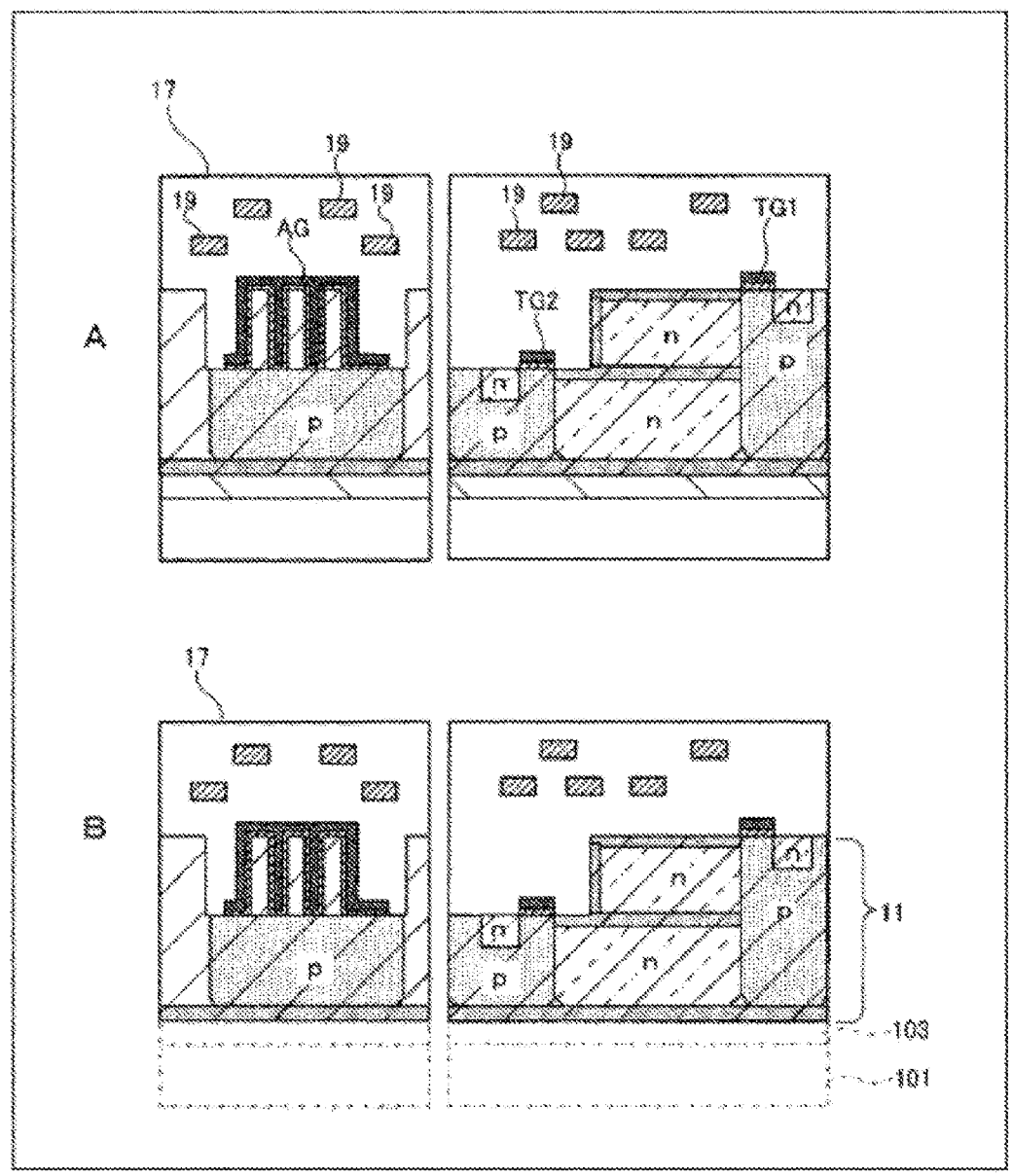
FIG. 12 is a (third) diagram showing the process for manufacturing the solid-state imaging device according to the second embodiment.

Referring now to the cross-sectional process diagrams shown in FIGS. 10 through 12, a method of manufacturing the solid-state imaging device 1-2 having the above described structure is described.

[A of FIG. 10]

First, as shown in A of FIG. 10, a SOI (silicon on insulator) substrate having the semiconductor layer 11 formed thereon via an oxide film 103 is prepared on a supporting substrate 101. The oxide film 103 is made of silicon oxide, for example, and the semiconductor layer 11 is made of n-type silicon. The face of the semiconductor layer 11 facing the oxide film 103 is the light receiving surface A. The face on the opposite side from the light receiving surface A is the surface.

[B of FIG. 10]

As shown in B of FIG. 10, the interface region 25 having a p-type impurity implanted therein is formed on the entire surface of the interface layer on the side of the light receiving surface A of the semiconductor layer 11. The interface region 63 having a p-type impurity implanted therein is formed in a position including the photodiode formation region a in the surface layer on the opposite side of the semiconductor layer 11 from the light receiving surface A. At this point, the p-type interface region 63 is not formed in the amplifying transistor formation region b.

Further, in the photodiode formation region a in the semiconductor layer 11, the n-type charge storage region 71, the p-type separation region 73, and the n-type charge storage region 61 are formed in this order from the side of the light receiving surface A. The n-type charge storage region 61 is formed in such a manner as to be in contact with the p-type interface region 63. As a result, the exposed photodiode PD1 and the embedded photodiode PD2 that are separated by the p-type separation region 73 and are stacked in the semiconductor layer 11 are obtained.

On one side of the photodiode formation region a in the semiconductor layer 11, the p-type well region 67 is formed between the p-type interface region 63 and the p-type interface region 25. On the other side of the photodiode formation region a in the semiconductor layer 11, the p-type well region 75 is formed between the p-type separation region 73 and the p-type interface region 25. In the same procedure as the formation of the well region 75, the well region 41 having a p-type impurity implanted therein is also formed in the amplifying transistor formation region b in the semiconductor layer 11 and in a deep region on the side of the light receiving surface A of the semiconductor layer 11. The well region 41 is formed in contact with the interface region 25.

Although not shown in the drawings, a plug having an n-type impurity implanted therein, for example, is formed so as to penetrate into the semiconductor layer 11 at a location not overlapping with the photodiode formation region a, and the n-type charge storage region 53 (see FIG. 8) connected to the plug is further formed in the surface layer of the semiconductor layer 11. This plug is not necessarily formed with an impurity region, and may be formed by filling an insulator-coated connection hole with a conductive material such as tungsten W.

The regions having impurities of the respective conductivity types implanted therein are formed by using ion implantation followed by annealing, and, if necessary, epitaxial growth. However, the regions may be formed by ion implantation in any order. Also, the ion implantation for forming the regions other than the interface region 25 is performed with respective resist patterns serving as masks.

[C of FIG. 10]

As shown in C of FIG. 10, the concave portion 31 and the convex strips 33 are formed on the surface layer on the opposite side of the semiconductor layer 11 from the light receiving surface A in a single procedure. The concave portion 31 is formed in such a position that the n-type charge storage region 61 is exposed through a sidewall thereof, and has such a depth d that the well region 75 is exposed through the bottom portion. At this point, the portion of the charge storage region 71 covered with the separation region 73 may be exposed through the bottom portion of the concave portion 31.

In the amplifying transistor formation region b, the convex strips 33 are formed to have a height h (=d) by removing the portions of the semiconductor layer 11 surrounding the convex strips 33. In this situation, the convex strips 33 may penetrate into the well region 41. Also, a space may be formed between the convex strips 33 and the well region 41, as long as leakage current is ignorable. In a case where a space is formed between the convex strips 33 and the well region 41, however, the well region 75 is not exposed through the bottom portion of the concave portion 31 formed in the same procedure as the convex strips 33. Therefore, a p-type impurity is selectively implanted into the bottom portion of the concave portion 31, so that the well region 75 is formed to face the bottom portion of the concave portion 31.

The concave portion 31 and the convex strips 33 described above are formed by anisotropic etching, with a resist pattern being used as a mask.

[A of FIG. 11]

As shown in A of FIG. 11, the p-type interface region 65 is then formed in such a manner as to cover the n-type charge storage region 61 exposed through a sidewall of the concave portion 31. The formation of the interface region 65 located on a sidewall is performed by ion implantation from an oblique direction, followed by annealing, for example. If necessary, ion implantation is also performed with the use of a mask.

[B of FIG. 11]

As shown in B of FIG. 11, the transfer gate TG1 is formed on the surface of the semiconductor layer 11 at a location adjacent to the charge storage region 61 of the photodiode PD1, and the transfer gate TG2 is formed in the bottom portion of the concave portion 31 at a location adjacent to the charge storage region 71 of the photodiode PD2. In the same procedure as above, the amplifier gate AG extending in the direction perpendicular to the convex strips 33 is also formed in the amplifying transistor formation region b. In the same procedure as above, the transfer gate TG3 not shown in this drawing is further formed at a location that does not overlap with the photodiode formation region a.

In this procedure, the gate insulating film 13 is first formed on the exposed surface of the semiconductor layer 11 by thermal oxidation, and a gate electrode film made of polysilicon, for example, is formed on the gate insulating film 13. Patterning is then performed on the gate electrode film and the gate insulating film 13 by anisotropic etching using a resist pattern as a mask, to obtain the transfer gates TG1, TG2, and TG3, and the amplifier gate AG.

[C of FIG. 11]

As shown in C of FIG. 11, the floating diffusion FD1 having an n-type impurity implanted therein is then formed in the surface layer of the well region 67 adjacent to the charge storage region 61. Further, the floating diffusion FD2 having an n-type impurity implanted therein is formed in the surface layer of the well region 75 adjacent to the charge storage region 71 in the bottom portion of the concave portion 31. In the same procedure as above, the floating diffusion FD3 shown in FIG. 8 is also formed at a location close to the charge storage region 53.

In this procedure, the floating diffusions FD1, FD2, and FD3 are formed by ion implantation followed by annealing, with resist patterns and the transfer gates TG1, TG2, and TG3 being used as masks.

Also, as shown in FIG. 8, the source 43s and the drain 43d that have an n-type impurity implanted therein are formed at the sides of the amplifier gate AG in the amplifying transistor formation region b. In this procedure, the source 43s and the drain 43d are formed by ion implantation followed by annealing, with a resist pattern and the amplifier gate AG being used as a mask. In this manner, the fully-depleted amplifying transistor Tr3 having the convex strips 33 as the channel is obtained.

The formation of the floating diffusions FD1, FD2, and FD3, and the formation of the source 43s and the drain 43d described above may be performed in a single procedure.

[A of FIG. 12]

As shown in A of FIG. 12, a procedure for forming the interlayer insulating film 17 on the semiconductor layer 11 in such a manner as to cover the transfer gates TG1 and TG2 as well as the amplifier gate AG and fill the grooves, a procedure for forming connection holes (not shown) in the interlayer insulating film 17, and a procedure for forming the interconnects 19 on the interlayer insulating film 17 are carried out. After that, those procedures are sequentially repeated, and the procedure for forming the interlayer insulating film 17 is carried out at last. In this manner, the interconnect layer in which the interconnects 19 insulated by the interlayer insulating film 17 are stacked to form a multilayer is formed on the surface on the opposite side of the semiconductor layer 11 from the light receiving surface A.

[B of FIG. 12]

As shown in B of FIG. 12, the supporting substrate 101 and the oxide film 103 are removed from the side of the light receiving surface A of the semiconductor layer 11, to expose the light receiving surface A of the semiconductor layer 11.

[FIG. 9]

After that, as shown in FIG. 9, the protective insulating film 21 is formed on the light receiving surface A of the semiconductor layer 11, and connection holes to reach the plugs not shown in the drawing are formed in the protective insulating film 21. The pixel electrodes 55 made of a transparent conductive material are then formed on the protective insulating film 21 by patterning. At this point, the respective pixel electrodes 55 are formed in such a manner as to be connected to the plugs via the connection holes. As a result, the respective pixel electrodes 55 are connected to the charge storage region 53 (see FIG. 8) via the plugs.

A separation insulating film 81 for dividing the pixel electrodes 55 is then formed by patterning in such a manner as to cover the peripheral regions of the pixel electrodes 55. The photoelectric conversion film 57 made of an organic photoelectric conversion material is then formed over the pixel electrodes 55, and the shared electrode 59 made of a transparent conductive material is further formed for all the pixels.

After that, an insulating film 83 is formed on the shared electrode 59, and the on-chip lens 23 is formed thereon. Also, an antireflection film and a light shielding film that are not shown in the drawing are formed between the shared electrode 59 and the on-chip lens 23, if necessary. In this manner, the solid-state imaging device 1-2 is completed.

<Effects of the Manufacturing Method According to the Second Embodiment>

By the above described manufacturing method, the convex strips 33 that serve as the channel portion of the amplifying transistor Tr3, and the concave portion 31 accommodating the floating diffusion FD2 corresponding to the embedded photodiode PD2 and the transfer gate TG2 are formed in a single procedure. Also, the amplifier gate AG and the transfer gates TG1, TG2, and TG3 are formed in a single procedure. Further, the floating diffusions FD1, FD2, and FD3, and the source 43s and the drain 43d are formed in a single procedure. Accordingly, the solid-state imaging device 1-2 according to the second embodiment can be obtained in a simpler manner.

In the first and second embodiments described above, a structure having the amplifier gate AG that extends in the direction perpendicular to the convex strips 33 is used as the amplifying transistor Tr3 of a fully-depleted type. However, some other structure, such as a FD (Fully Depleted)-SOI, may be used as the fully-depleted amplifying transistor Tr3 in a solid-state imaging device according to the present technique.

4. Third Embodiment

Examples of Electronic Apparatuses Using Solid-State Imaging Devices

Solid-state imaging devices according to the present technique described in the above embodiments can be used as solid-state imaging devices for electronic apparatuses, such as camera systems like a digital camera and a video camera, portable telephone devices having imaging functions, and other apparatuses having imaging functions.

Figure 13:
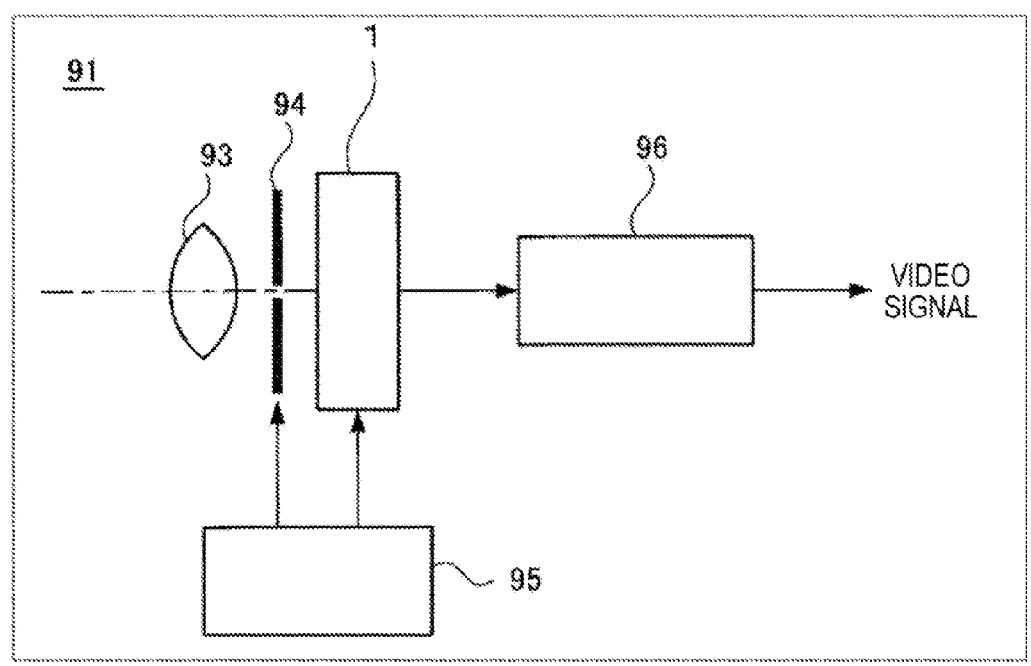
FIG. 13 is a schematic view of an example structure of an electronic apparatus according to a third embodiment.

FIG. 13 is a diagram showing the structure of a camera that includes a solid-state imaging device as an example electronic apparatus according to the present technique. The camera according to this embodiment is a video camera that is capable of capturing a still image or a moving image. This camera 91 includes a solid-state imaging device 1, an optical system 93 that guides incident light to the light receiving sensor unit of the solid-state imaging device 1, a shutter device 94, a drive circuit 95 that drives the solid-state imaging device 1, and a signal processing circuit 96 that process an output signal of the solid-state imaging device 1.

The solid-state imaging device 1 is a solid-state imaging device having the structure described in the first or second embodiment. The optical system (an optical lens) 93 gathers image light (incident light) from an object onto the imaging surface of the solid-state imaging device 1. On this imaging surface, pixels are arranged, and the incident light from the optical system 93 is guided to the photoelectric conversion region of the solid-state imaging elements forming the pixels. As a result, signal charges are stored in the photoelectric conversion region of the solid-state imaging device 1 for a certain period of time. Such an optical system 93 may be an optical lens system formed with optical lenses. The shutter device 94 controls the period to emit light to the solid-state imaging device 1 and the period to shield light. The drive circuit 95 supplies a drive signal to the solid-state imaging device 1 and the shutter device 94, and controls the solid-state imaging device 1 to output a signal to the signal processing circuit 96 and the shutter device 94 to perform a shutter operation in accordance with the supplied drive signal (a timing signal). That is, the drive circuit 95 performs an operation to transfer a signal from the solid-state imaging device 1 to the signal processing circuit 96 by supplying a drive signal (timing signal). The signal processing circuit 96 performs various kinds of signal processing on the signal transferred from the solid-state imaging device 1. The video signal subjected to the signal processing is stored into a storage medium such as a memory, or is output to a monitor.

The above described electronic apparatus according to this embodiment includes a solid-state imaging device that is small in size and has a high degree of integration as described above in each of the embodiments. Accordingly, a reduction in size and an increase in the degree of integration can be achieved in the electronic apparatus having an imaging function.

The present technique can also be in the following forms.

(1)
A solid-state imaging device including:
a photoelectric conversion unit;
a transfer gate that reads out charges from the photoelectric conversion unit;
a floating diffusion from which the charges of the photoelectric conversion unit are read by an operation of the transfer gate; and
an amplifying transistor of a fully-depleted type that is connected to the floating diffusion.

(2)
The solid-state imaging device of (1), wherein the channel portion of the amplifying transistor is formed with an intrinsic semiconductor.

(3)
The solid-state imaging device of (1) or (2), wherein the amplifying transistor includes:
convex strips formed by processing a surface layer of a semiconductor layer; and
a gate electrode on the semiconductor layer, the gate electrode extending in a direction perpendicular to the convex strips.

(4)
The solid-state imaging device of (3), wherein
the convex strips are arranged in parallel, and
the gate electrode extends in the direction perpendicular to the convex strips.

(5)
The solid-state imaging device of any of (1) through (4), wherein
the photoelectric conversion unit is located in the semiconductor layer,
the transfer gate is located on a sidewall of a concave portion formed by processing the surface layer of the semiconductor layer along the photoelectric conversion unit, and
the floating diffusion is located at a bottom portion of the concave portion.

(6)
The solid-state imaging device of (5), wherein the amplifying transistor includes:
convex strips formed by processing a surface layer of the semiconductor layer; and
a gate electrode on the semiconductor layer, the gate electrode extending in a direction perpendicular to the convex strips, and
the steps formed by the concave portion are equal in height to the steps formed by the convex strips.

(7)
The solid-state imaging device of any of (1) through (4), wherein
the photoelectric conversion unit includes:
an exposed-type photoelectric conversion unit formed in a surface layer of the semiconductor layer; and
an embedded-type photoelectric conversion unit that is buried in the semiconductor layer in such a manner as to be stacked on the exposed-type photoelectric conversion unit, and faces the bottom face of a concave portion formed in the semiconductor layer, and
the floating diffusion includes:
a floating diffusion that is formed in a surface layer of the semiconductor layer and is located close to the exposed-type photoelectric conversion unit, and
a floating diffusion that is formed in a bottom face layer of the concave portion and is located close to the embedded-type photoelectric conversion unit.

(8)
The solid-state imaging device of (7), wherein the amplifying transistor includes:
convex strips formed by processing a surface layer of the semiconductor layer; and
a gate electrode on the semiconductor layer, the gate electrode extending in a direction perpendicular to the convex strips, and
the steps formed by the concave portion are equal in height to the steps formed by the convex strips.

(9)
The solid-state imaging device of (7) or (8), wherein a photoelectric conversion unit formed with a photoelectric conversion film is placed on the reverse face of the semiconductor layer while being stacked on the photoelectric conversion unit.

(10)
A solid-state imaging device including:
a semiconductor layer having a concave portion formed therein;
a photoelectric conversion unit formed in the semiconductor layer along a sidewall of the concave portion;
a transfer gate formed on the sidewall of the concave portion along the photoelectric conversion unit; and
a floating diffusion that is formed to face a bottom portion of the concave portion.

(11)
The solid-state imaging device of (10), wherein the transfer gate extends from the sidewall of the concave portion to the bottom portion of the concave portion.

(12)
The solid-state imaging device of (10) or (11), wherein the transfer gate extends from the surface of the semiconductor layer to a sidewall of the concave portion.

(13)
A solid-state imaging device manufacturing method including:
forming convex strips by processing a surface layer of a semiconductor layer;
forming a photoelectric conversion unit in the semiconductor layer;
forming a floating diffusion in the surface layer of the semiconductor layer, the floating diffusion being located close to the photoelectric conversion unit; and
forming a transfer gate on the surface of the semiconductor layer between the photoelectric conversion unit and the floating diffusion, and a gate electrode connected to the floating diffusion, the gate electrode extending in a direction perpendicular to the convex strips.

(14)
The Solid-State Imaging Device Manufacturing Method of (13), Wherein
the forming the convex strips includes forming a concave portion on the surface side of the semiconductor layer, the concave portion forming steps having a height equal to the height of the convex strips,
the forming the photoelectric conversion unit includes forming a photoelectric conversion unit at a location along a sidewall of the concave portion in the semiconductor layer, and
the forming the floating diffusion includes forming a floating diffusion facing a bottom portion of the concave portion.

(15)
The solid-state imaging device manufacturing method of (14), wherein the transfer gate is formed on the sidewall of the concave portion along the photoelectric conversion unit.

(16)

The solid-state imaging device manufacturing method of (13), wherein the forming the convex strips includes forming a concave portion on the surface side of the semiconductor layer, the concave portion forming steps having a height equal to the height of the convex strips, the forming the photoelectric conversion unit includes forming a photoelectric conversion unit at a location along a sidewall of the concave portion in the semiconductor layer, and a photoelectric conversion unit at such a location as to be stacked on the photoelectric conversion unit, and the forming the floating diffusion includes forming a floating diffusion in a surface layer of the semiconductor layer, and a floating diffusion at a location facing the bottom portion of the concave portion.

(17)

An electronic apparatus including:

a photoelectric conversion unit;

a transfer gate that reads out charges from the photoelectric conversion unit;

a floating diffusion from which the charges of the photoelectric conversion unit are read by an operation of the transfer gate;

an amplifying transistor of a fully-depleted type that is connected to the floating diffusion; and an optical system that guides incident light to the photoelectric conversion unit.

REFERENCE SIGNS LIST 1, 1-1, 1-2 . . . Solid-state imaging device, 11 . . . Semiconductor layer, 31 . . . Concave portion, 33 . . . Convex strips, 51 . . . Photoelectric conversion film (photoelectric conversion unit), 93 . . . Optical system, 90 . . . Electronic apparatus, AG . . . Amplifier gate (gate electrode), FD, FD1, FD2, FD3 . . . Floating diffusion, PD . . . Photodiode (photoelectric conversion unit), PD1 . . . Exposed photodiode, PD2 . . . Embedded photodiode (photoelectric conversion unit), TG, TG1, TG2, TG3 . . . Transfer gate, Tr3 . . . Amplifying transistor

The invention claimed is:

1. A solid-state imaging device comprising:
   a photoelectric conversion device;
   a transfer gate configured to read out charges from the photoelectric conversion device;
   a floating diffusion from which the charges of the photoelectric conversion device are read by an operation of the transfer gate; and
   an amplifying transistor of a fully-depleted type connected to the floating diffusion,
   wherein the amplifying transistor includes:
   a convex strip formed by processing a surface layer of a semiconductor layer; and
   a gate electrode on the semiconductor layer, the gate electrode extending in a direction perpendicular to the convex strip.

2. The solid-state imaging device according to claim 1, wherein a channel portion of the amplifying transistor is formed with an intrinsic semiconductor.

3. The solid-state imaging device according to claim 1, wherein
   a plurality of convex strips are arranged in parallel, each of the convex strips being the same as the convex strip, and the gate electrode extends in a direction perpendicular to the convex strips.

4. The solid-state imaging device according to claim 1, wherein
   the photoelectric conversion device is located in the semiconductor layer,
   the transfer gate is located on a sidewall of a concave portion formed by processing the surface layer of the semiconductor layer along the photoelectric conversion device, and
   the floating diffusion is located at a bottom portion of the concave portion.

5. The solid-state imaging device according to claim 4, wherein the amplifying transistor includes:
   a step formed by the concave portion is equal in height to a step formed by the convex strip.

6. The solid-state imaging device according to claim 1, wherein the photoelectric conversion device includes:
   an exposed-type photoelectric conversion device formed in a surface layer of the semiconductor layer; and
   an embedded-type photoelectric conversion device buried in the semiconductor layer in such a manner as to be stacked on the exposed-type photoelectric conversion device, the embedded-type photoelectric conversion device facing a bottom face of a concave portion formed in the semiconductor layer, and
   the floating diffusion includes:
   a floating diffusion formed in a surface layer of the semiconductor layer, the floating diffusion being located close to the exposed-type photoelectric conversion device, and
   a floating diffusion formed in a bottom face layer of the concave portion, the floating diffusion being located close to the embedded-type photoelectric conversion device.

7. The solid-state imaging device according to claim 6, wherein the amplifying transistor includes:
   a step formed by the concave portion is equal in height to a step formed by the convex strip.

8. The solid-state imaging device according to claim 6, wherein a photoelectric conversion device formed with a photoelectric conversion film is placed on a reverse face of the semiconductor layer while being stacked on the photoelectric conversion device.

9. A solid-state imaging device comprising:
   a semiconductor layer having a concave portion formed therein;
   a photoelectric conversion device formed in the semiconductor layer along a sidewall of the concave portion;
   a transfer gate formed on the sidewall of the concave portion along the photoelectric conversion device; and
   a floating diffusion formed to face a bottom portion of the concave portion,
   wherein the transfer gate extends from the sidewall of the concave portion to the bottom portion of the concave portion.

10. The solid-state imaging device according to claim 9, wherein the transfer gate extends from a surface of the semiconductor layer to the sidewall of the concave portion.

11. A solid-state imaging device manufacturing method comprising:
    forming a convex strip by processing a surface layer of a semiconductor layer;
    forming a photoelectric conversion device in the semiconductor layer;
    forming a floating diffusion in a surface layer of the semiconductor layer, the floating diffusion being located close to the photoelectric conversion device; and forming a transfer gate on a surface of the semiconductor layer between the photoelectric conversion device and the floating diffusion, and a gate electrode connected to the floating diffusion, the gate electrode extending in a direction perpendicular to the convex strip.

12. The solid-state imaging device manufacturing method according to claim 11, wherein the forming the convex strip includes forming a concave portion on the surface side of the semiconductor layer, the concave portion forming a step having a height equal to a height of the convex strip, the forming the photoelectric conversion device includes forming a photoelectric conversion device at a location along a sidewall of the concave portion in the semiconductor layer, and the forming the floating diffusion includes forming a floating diffusion facing a bottom portion of the concave portion.

13. The solid-state imaging device manufacturing method according to claim 12, wherein the transfer gate is formed on the sidewall of the concave portion along the photoelectric conversion device.

14. The solid-state imaging device manufacturing method according to claim 11, wherein the forming the convex strips includes forming a concave portion on the surface side of the semiconductor layer, the concave portion forming a step having a height equal to a height of the convex strip, the forming the photoelectric conversion device includes forming a photoelectric conversion device at a location along a sidewall of the concave portion in the semiconductor layer, and a photoelectric conversion device at such a location as to be stacked on the photoelectric conversion device, and the forming the floating diffusion includes forming a floating diffusion in a surface layer of the semiconductor layer, and a floating diffusion at a location facing a bottom portion of the concave portion.

15. An electronic apparatus comprising:

a photoelectric conversion device;

a transfer gate configured to read out charges from the photoelectric conversion device;

a floating diffusion from which the charges of the photoelectric conversion device are read by an operation of the transfer gate;

an amplifying transistor of a fully-depleted type connected to the floating diffusion; and an optical system configured to guide incident light to the photoelectric conversion device, wherein the amplifying transistor includes:

a convex strip formed by processing a surface layer of a semiconductor layer; and a gate electrode on the semiconductor layer, the gate electrode extending in a direction perpendicular to the convex strip.

* * * * *